(12) United States Patent
Odnoblyudov et al.

(10) Patent No.: US 10,074,567 B2
(45) Date of Patent: Sep. 11, 2018

(54) METHOD AND SYSTEM FOR VERTICAL INTEGRATION OF ELEMENTAL AND COMPOUND SEMICONDUCTORS

(71) Applicant: QROMIS, Inc., Santa Clara, CA (US)

(72) Inventors: Vladimir Odnoblyudov, Danville, CA (US); Cem Basceri, Los Gatos, CA (US); Shari Farrens, Boise, ID (US)

(73) Assignee: QROMIS, Inc., Santa Clara, CA (US)

(*) Notice: Subject to any disclaimer, the term of this patent is extended or adjusted under 35 U.S.C. 154(b) by 0 days.

(21) Appl. No.: 15/788,606

(22) Filed: Oct. 19, 2017

(65) Prior Publication Data

US 2018/0114726 A1  Apr. 26, 2018

Related U.S. Application Data

(60) Provisional application No. 62/411,148, filed on Oct. 21, 2016.

(51) Int. Cl.
*H01L 21/00* (2006.01)
*H01L 21/822* (2006.01)
(Continued)

(52) U.S. Cl.
CPC ...... *H01L 21/8221* (2013.01); *H01L 21/0242* (2013.01); *H01L 21/0245* (2013.01); *H01L 21/0254* (2013.01); *H01L 21/02488* (2013.01); *H01L 21/02505* (2013.01); *H01L 21/02516* (2013.01); *H01L 21/02532* (2013.01); *H01L 21/76898* (2013.01); *H01L 21/7806* (2013.01); *H01L 21/8252* (2013.01); *H01L 21/823871* (2013.01); *H01L 23/481* (2013.01); *H01L 27/0605* (2013.01); *H01L 27/0694* (2013.01);
(Continued)

(58) Field of Classification Search
CPC .......... H01L 21/8221; H01L 21/0245; H01L 21/8252; H01L 27/0605; H01L 21/76898
See application file for complete search history.

(56) References Cited

U.S. PATENT DOCUMENTS 8,686,428 B1 * 4/2014 Sekar ................ H01L 21/8221
257/173
8,742,476 B1 * 6/2014 Or-Bach ............ H01L 27/0688
257/275

(Continued)

*Primary Examiner* — Laura Menz
(74) *Attorney, Agent, or Firm* — Kilpatrick Townsend & Stockton LLP

(57) ABSTRACT

A method of fabricating a semiconductor structure includes providing an engineered substrate including a polycrystalline substrate, a barrier layer encapsulating the polycrystalline substrate, and a bonding layer coupled to the barrier layer. The method further includes forming a first silicon layer coupled to the bonding layer, forming a dielectric layer coupled to the first silicon layer, forming a second silicon layer coupled to the dielectric layer, forming a GaN layer coupled to the second silicon layer, forming a GaN based device coupled to the GaN layer, removing the engineered substrate to expose a back surface of the first silicon layer, forming a silicon based device coupled to the back surface of the first silicon layer, forming a via from the back surface of the first silicon layer, filling the via with a conducting material, and interconnecting the GaN based device and the silicon based device through the via.

20 Claims, 33 Drawing Sheets

(51) Int. Cl.
*H01L 29/20* (2006.01)
*H01L 21/02* (2006.01)
*H01L 21/78* (2006.01)
*H01L 21/8252* (2006.01)
*H01L 21/8238* (2006.01)
*H01L 21/768* (2006.01)
*H01L 27/06* (2006.01)
*H01L 27/092* (2006.01)
*H01L 23/48* (2006.01)
*H01L 29/16* (2006.01)

(52) U.S. Cl.
CPC ............ *H01L 27/092* (2013.01); *H01L 29/16* (2013.01); *H01L 29/2003* (2013.01)

(56) References Cited

U.S. PATENT DOCUMENTS

| | | | |
|---|---|---|---|
| 9,023,688 B1* | 5/2015 | Or-Bach | H01L 23/3677 |
| | | | 257/E21.532 |
| 9,640,531 B1* | 5/2017 | Or-Bach | H01L 27/0688 |
| 9,786,636 B2* | 10/2017 | Or-Bach | H01L 25/0657 |
| 9,806,230 B2* | 10/2017 | Park | H01L 33/12 |
| 9,911,627 B1* | 3/2018 | Or-Bach | H01L 21/4871 |
| 9,941,275 B2* | 4/2018 | Or-Bach | H01L 27/0688 |
| 2017/0200716 A1* | 7/2017 | Or-Bach | H01L 23/544 |
| 2017/0213821 A1* | 7/2017 | Or-Bach | H01L 23/481 |
| 2018/0114726 A1* | 4/2018 | Odnoblyudov | H01L 21/8221 |

\* cited by examiner

METHOD AND SYSTEM FOR VERTICAL INTEGRATION OF ELEMENTAL AND COMPOUND SEMICONDUCTORS

CROSS-REFERENCES TO RELATED APPLICATIONS

This application claims the benefit of U.S. Provisional Patent Application No. 62/411,148, filed on Oct. 21, 2016, the content of which is incorporated by reference in its entirety.

BACKGROUND OF THE INVENTION

Heteroepitaxy of gallium nitride based compound semiconductors on sapphire, silicon carbide and silicon are currently used in light-emitting devices (LEDs), high power devices and high speed radio frequency (RF) devices. Applications include lighting, computer monitors, displays, wide band gap communications, automotive and industrial power sources.

The growth of gallium nitride based devices such as LED structures on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to vertical integration of elemental and compound semiconductors utilizing a ceramic substrate. More specifically, the present invention relates to methods and systems suitable for use in epitaxial growth processes. Merely by way of example, the invention has been applied to methods and systems for vertically integrating GaN based devices and silicon based devices utilizing a ceramic substrate. The methods and techniques can be applied to a variety of semiconductor processing operations.

According to an embodiment of the present invention, a method of fabricating a semiconductor structure includes providing an engineered substrate. The engineered substrate may include a polycrystalline substrate, a barrier layer encapsulating the polycrystalline substrate, and a bonding layer coupled to the barrier layer. The method further includes forming a first silicon layer coupled to the bonding layer. The first silicon layer may be substantially single crystalline and may have a surface in a first crystalline orientation. The method further includes forming a dielectric layer coupled to the first silicon layer, and forming a second silicon layer coupled to the dielectric layer. The second silicon layer may be substantially single crystalline and may have a surface in a second crystalline orientation different from the first crystalline orientation. The method further includes forming a gallium nitride (GaN) layer coupled to the second silicon layer by epitaxial growth, forming a gallium nitride (GaN) based device coupled to the GaN layer by epitaxial growth, removing the engineered substrate to expose a back surface of the first silicon layer, forming a silicon based device coupled to the back surface of the first silicon layer, and forming a via from the back surface of the first silicon layer. The via may run through the first silicon layer, the dielectric layer, the second silicon layer, and the GaN layer. The method further includes filling the via with a conducting material, and interconnecting the GaN based device and the silicon based device through the via.

According to another embodiment of the present invention, a method of fabricating a semiconductor structure includes providing an engineered substrate. The engineered substrate includes a polycrystalline substrate, a barrier layer encapsulating the polycrystalline substrate, and a bonding layer coupled to the barrier layer. The method further includes forming a first silicon layer coupled to the bonding layer. The first silicon layer may be substantially single crystalline and may have a surface in a first crystalline orientation. The method further includes forming a first dielectric layer coupled to the first silicon layer, and forming a second silicon layer coupled to the first dielectric layer. The second silicon layer may be substantially single crystalline and may have a surface in a second crystalline orientation different from the first crystalline orientation. The method further includes forming a gallium nitride (GaN) layer coupled to the second silicon layer by epitaxial growth, removing the engineered substrate to expose a back surface of the first silicon layer, and forming a first plurality of vias from the back surface of the first silicon layer. Each of the first plurality of vias may run through the first silicon layer, the first dielectric layer, the second silicon layer, and into the GaN layer. The method further includes filling each of the first plurality of vias with a first conductive material, forming a second dielectric layer coupled to the first silicon layer, and forming a third silicon layer coupled to the second dielectric layer. the third silicon layer may be substantially single crystalline and may have a surface in the first crystalline orientation. The method further includes forming a second via from a surface of the third silicon layer. The second via may run through the third silicon layer and the second dielectric layer to connect with one of the first plurality of vias. The method further includes filling the second via with a second conductive material, forming a silicon based device coupled to the third silicon layer and the second via, and forming a third via from a surface of the GaN layer. The third via connects with the second via through the one of the first plurality of vias. The method further includes filling the third via with a third conductive material, and forming a gallium nitride (GaN) based device coupled to the GaN layer and the third via, wherein the GaN based device is coupled to the silicon based device through the third via, the one of the first plurality of vias, and the third via.

According to a further embodiment of the present invention, a method of fabricating a semiconductor structure includes providing an engineered substrate. The engineered substrate includes a polycrystalline substrate, a barrier layer encapsulating the polycrystalline substrate, and a bonding layer coupled to the barrier layer. The method further includes forming a first silicon layer coupled to the bonding layer. The first silicon layer may be substantially single crystalline and may have a surface in a first crystalline orientation. The method further includes forming a first dielectric layer coupled to the first silicon layer, and forming a second silicon layer coupled to the first dielectric layer. The second silicon layer may be substantially single crystalline and may have a surface in a second crystalline orientation different from the first crystalline orientation. The method further includes forming a gallium nitride (GaN) layer coupled to the second silicon layer by epitaxial growth, removing the engineered substrate to expose a back surface of the first silicon layer, and forming a first plurality of vias from the back surface of the first silicon layer. Each of the first plurality of vias may run through the first silicon layer, the first dielectric layer, the second silicon layer, and into the GaN layer. The method further includes filling each of the first plurality of vias with a first conductive material, forming a second dielectric layer coupled to the first silicon layer, and forming a third silicon layer coupled to the second dielectric layer. The third silicon layer may be substantially single crystalline and may have a surface in the first crystalline orientation. The method further includes forming a second via from a surface of the GaN layer. The second via connectes with one of the first plurality of vias. The method further includes filling the second via with a second conductive material, forming a gallium nitride (GaN) based device coupled to the GaN layer and the second via, and forming a third via from a surface of the third silicon layer. The third via may run through the third silicon layer and the second dielectric layer to connect with the one of the first plurality of vias, thereby connecting with the second via. The method further includes filling the third via with a third conductive material, and forming a silicon-based coupled to the third silicon layer and the third via. The silicon based device is coupled to the GaN based device through the third via, the one of the first plurality of vias, and the second via.

Several advantages may be realized by taking advantage of the ability to match the coefficient of thermal expansion (CTE) of the substrate to the epitaxial layer and the thin compliant silicon seed layer. For example, the advantages may include extremely low defect density device layers, the ability to grow a broader range of thicknesses on the compliant template materials, and retention of improved thermal performance. Furthermore, the ability to integrate III-V compound semiconductor devices with standard silicon processes can enable integration of complementary metal-oxide-semiconductor (CMOS) devices, RF devices, LEDs, and power devices at a chip level.

These and other embodiments of the invention along with many of its advantages and features are described in more detail in conjunction with the text below and attached figures.

DETAILED DESCRIPTION OF SPECIFIC EMBODIMENTS

Embodiments of the present invention relate to vertical integration of elemental and compound semiconductors utilizing a ceramic substrate. More specifically, the present invention relates to methods and systems suitable for use in epitaxial growth processes. Merely by way of example, the invention has been applied to methods and systems for vertically integrating GaN based devices and silicon based devices utilizing a ceramic substrate. The methods and techniques can be applied to a variety of semiconductor processing operations.

Figure 1:
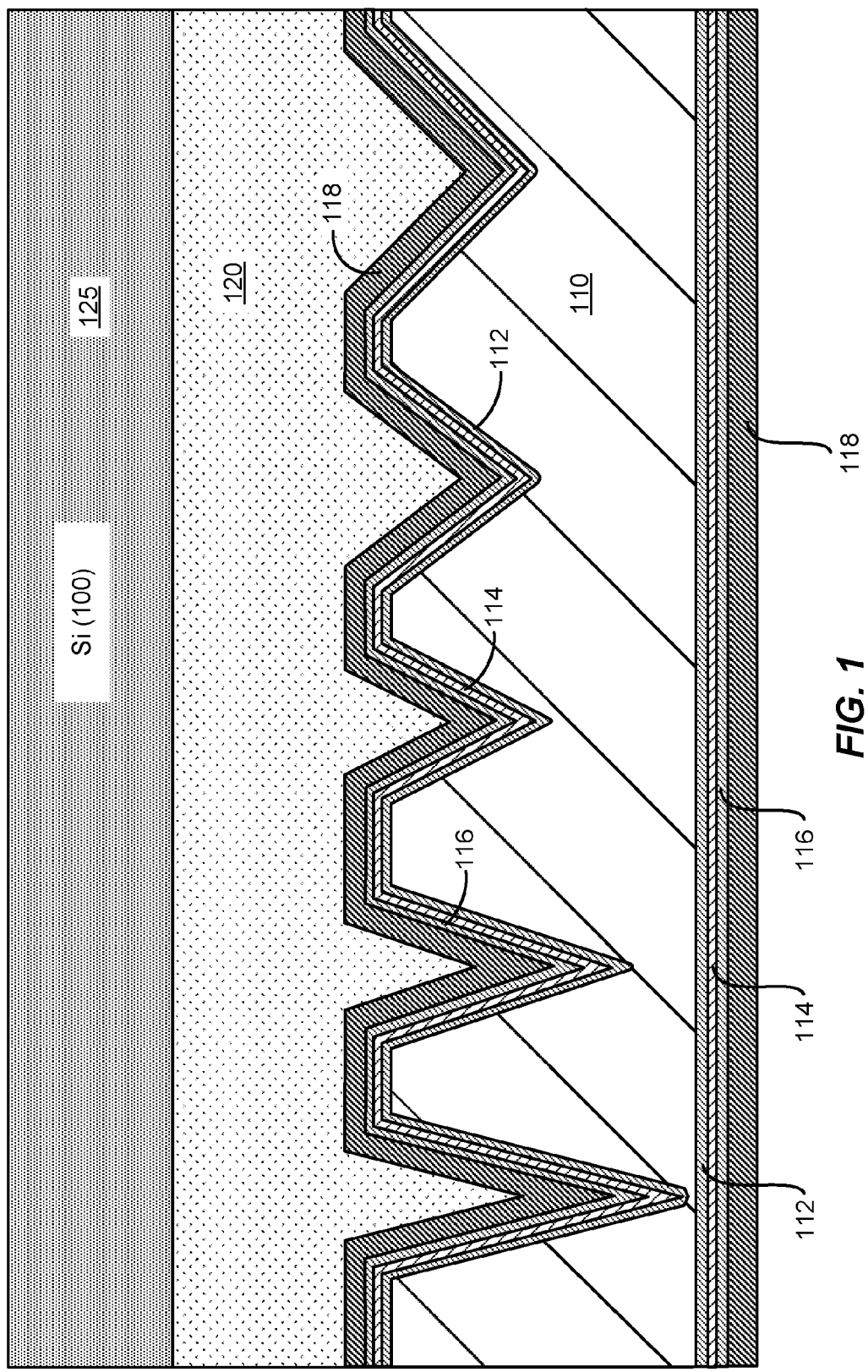
FIG. 1 is a schematic cross-sectional diagram illustrating an engineered substrate structure according to an embodiment of the present invention.

FIG. 1 is a simplified schematic diagram illustrating an engineered substrate structure according to an embodiment of the present invention. As illustrated in FIG. 1, the engineered substrate structure may be suitable for a variety of electronic and optical applications. The engineered substrate structure includes a core 110 (e.g., AlN Substrate) that can have a coefficient of thermal expansion (CTE) that is substantially matched to the CTE of the epitaxial material that will be grown on the engineered substrate structure, for example, on the exfoliated silicon (111) layer 125.

For applications including the growth of gallium nitride (GaN)-based materials (epitaxial layers including GaN-based layers), the core 110 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 110 can be on the order of 100 to 1,500 μm, for example, 750 μm. The core 110 is encapsulated in an adhesion layer 112 that can be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer 112 varies, for example, from 100 Å to 2,000 Å. Although TEOS oxides are utilized for adhesion layers 112 in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 112 completely surrounds the core 110 in some embodiments to form a fully encapsulated core 110 and can be formed using an LPCVD process or other suitable deposition processes, which can be compatible with semiconductor processing and in particular with polycrystalline or composite substrates and layers. The adhesion layer 112 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core 110 can be utilized, the core 110 can be flipped over, and the deposition process could be repeated to coat additional portions of the core 110. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer 114 is a shell of polysilicon (i.e., polycrystalline silicon) that is formed surrounding the adhesion layer 112 since polysilicon can exhibit poor adhesion to ceramic materials. In embodiments in which the conductive layer 114 is polysilicon, the thickness of the polysilicon layer can be on the order of 500-5,000 Å, for example, 2,500 Å. In some embodiments, the polysilicon layer can be formed as a shell to completely surround the adhesion layer 112 (e.g., a TEOS oxide layer), thereby forming a fully encapsulated adhesion layer 112, and can be formed using an LPCVD process. In other embodiments, as discussed below, the conductive material can be formed on a portion of the adhesion layer 112, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a p-type polysilicon layer. In some embodiments, the doping with boron is at a level of $1 \times 10^{19}$ $cm^{-3}$ to $1 \times 10^{20}$ $cm^{-3}$ to provide for high conductivity. Other dopants at different dopant concentrations (e.g., phosphorus, arsenic, bismuth, or the like at dopant concentrations ranging from $1 \times 10^{16}$ $cm^{-3}$ to $5 \times 10^{18}$ $cm^{-3}$) can be utilized to provide either n-type or p-type semiconductor materials suitable for use in the conductive layer 114. One of ordinary skill in the art would recognize many variations, modifications, and alternatives.

The presence of the conductive layer 114 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer 114 enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 116 (e.g., a TEOS oxide layer on the order of 1,000 Å in thickness) is formed surrounding the conductive layer 114. The second adhesion layer 116 completely surrounds the conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer that is on the order of 2,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers 118. In some implementations, the barrier layer 118 consists of a number of sub-layers that are built up to form the barrier layer 118. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 118, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core 110 are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate structure to prevent this undesirable diffusion.

Referring once again to FIG. 1, a bonding layer 120 (e.g., a silicon oxide layer) is deposited on a portion of the barrier layer 118, for example, the top surface of the barrier layer 118, and subsequently used during the bonding of a substantially single crystal layer 125 (e.g., a single crystal silicon layer such as the exfoliated silicon (100) layer illustrated in FIG. 1). The bonding layer 120 can be approximately 1.5 µm in thickness in some embodiments. In some embodiments, the thickness of the bonding layer 120 is 20 nm or more for bond-induced void mitigation. In some embodiments, the thickness of the bonding layer 120 is in the range of 0.75-1.5 µm.

The engineered substrate illustrated in FIG. 1 may be suitable for integration of elemental and compound semiconductors according to various embodiments of the present invention, as discussed below.

Figure 2:
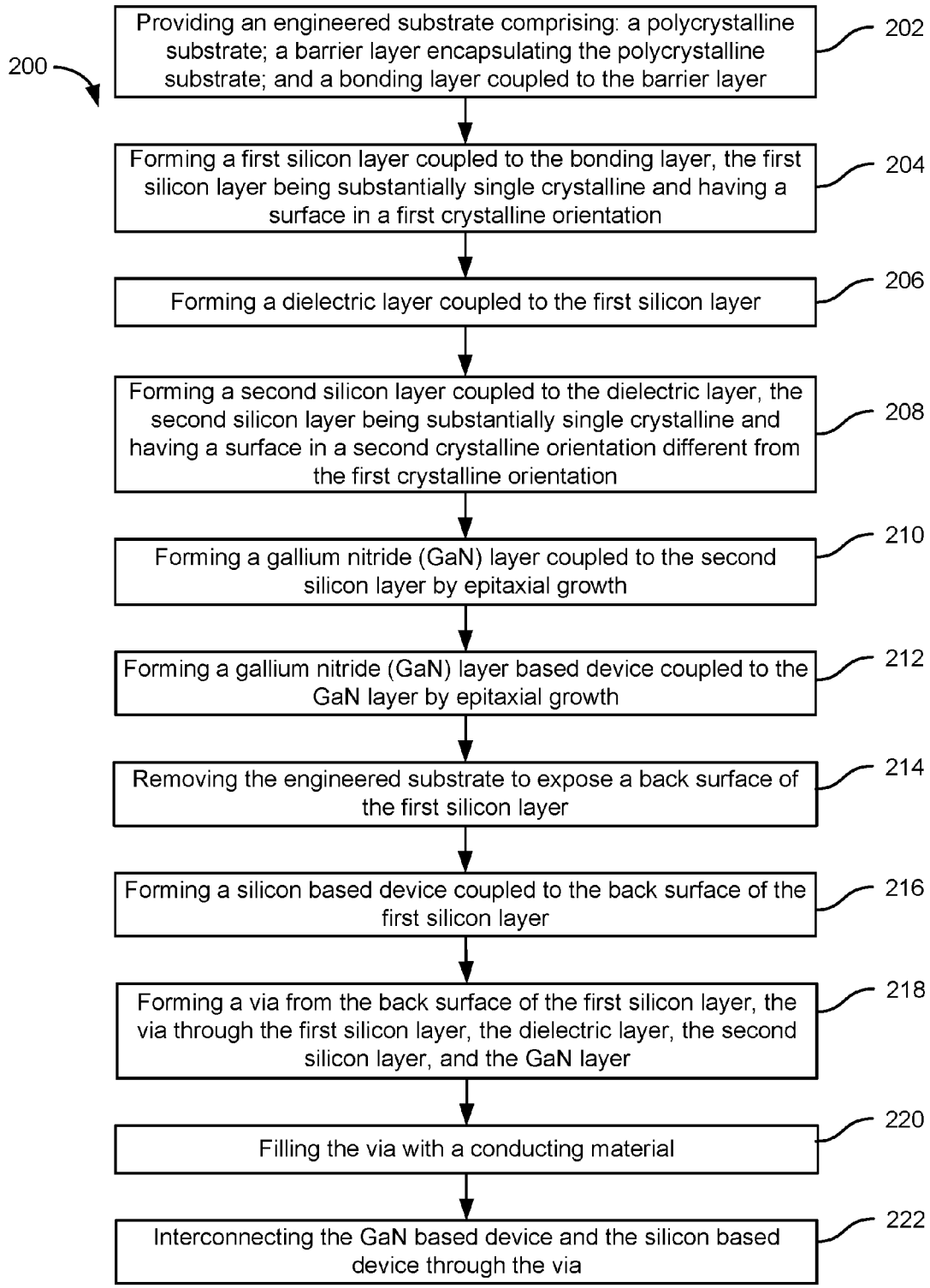
FIG. 2 is a simplified flowchart illustrating a method of fabricating a semiconductor structure according to an embodiment of the present invention.

FIG. 2 is a simplified flowchart illustrating a method 200 of vertical integration of elemental and compound semiconductors according to an embodiment of the present invention. The method 200 may include, at 202, providing an engineered substrate. With reference to FIG. 1, the engineered substrate may include a polycrystalline ceramic core 110, which can be an aluminum nitride (AlN) substrate that has been cleaned and inspected. Other polycrystalline ceramic cores can be utilized as discussed above. The engineered substrate may further include one or more adhesion layers 112 and 116(e.g., TEOS layers) and/or conductive layers 114 (e.g., polycrystalline silicon layers), as described above.

The engineered substrate may further include a barrier layer 118 encapsulating the polycrystalline ceramic core 110. The barrier layer 118 can be a single layer of silicon nitride, for example, approximately 400 nm in thickness. As described herein, embodiments of the present invention can utilize a variety of materials for the barrier layer 118, including a variety of dielectrics such as $Si_xO_y$, $Si_xN_y$, $Si_xO_yN_z$, diamond like carbon (DLC), combinations thereof, and the like. Other materials, such as Ti, TiW, Ta, and TiN encapsulated in dielectrics, may also be used. One of ordinary skill in the art would recognize many variations, modifications, and alternatives.

The engineered substrate may further include a bonding layer 120 coupled to the barrier layer 118. In some embodiments, the bonding layer 120 may be a silicon oxide layer deposited on the barrier layer 118 by PECVD. The deposition of the bonding layer 120 can include deposition of a bonding material followed by planarization processes. In some embodiments, the bonding layer 120 can be formed by a deposition (e.g., PECVD) of a thick (e.g., 4 µm thick) oxide layer followed by a chemical mechanical polishing (CMP) process to thin the oxide to approximately 1.5 µm in thickness. The thick initial oxide serves to fill voids and surface features present on the support structure that may be present after fabrication of the polycrystalline core 110 and continue to be present as the encapsulating layers are formed. The CMP process provides a substantially planar surface free of voids, particles, or other features, which can then be used during a wafer transfer process to bond the substantially single crystal layer 125 represented by the exfoliated single crystal silicon (e.g., Si (100)) layer illustrated in FIG. 1 to the bonding layer 120. It will be appreciated that the bonding layer 120 does not have to be characterized by an atomically flat surface, but should provide a substantially planar surface that will support bonding of the substantially single crystal layer 125 (e.g., a single crystal silicon layer) with the desired reliability.

Additional description related to the engineered substrate structure is provided in U.S. patent application Ser. No. 15/621,335, filed on Jun. 13, 2017 and U.S. patent application Ser. No. 15/621,235, filed on Jun. 13, 2017, the disclosures of which are hereby incorporated by reference in their entirety for all purposes.

The method 200 may further include, at 204, forming a first silicon layer 125 coupled to the bonding layer 120. The first silicon layer 125 may be substantially single crystalline, and having a surface in a first crystalline orientation, such as the (100) orientation of silicon. The first silicon layer 125 may be formed by a layer transfer process in which a single crystal silicon layer is transferred from a silicon wafer. An example of a layer transfer process that can be used to join a substantially single crystal layer to the bonding layer is the bonding of a hydrogen implanted donor wafer (e.g., a silicon wafer including a substantially single crystal layer (e.g., a single crystal silicon layer) that is implanted to form a cleave plane) to the bonding layer 120. The bonded pair is then annealed at a annealing temperature (e.g., 200° C.) for an annealing period (e.g., 4 hours) to cluster the implant species (e.g., hydrogen) into blisters. After annealing, the donor wafer fractures along the cleave plane and exfoliates a layer of substantially single crystal material onto the bonding layer 120. As illustrated in FIG. 1, the layer of Si (100) is exfoliated onto the PECVD bonding layer 120. The substantially single crystal layer 125 (e.g., exfoliated Si (100)) may be suitable for use as a substrate for fabricating silicon-based devices, such as complementary metal-oxide-semiconductor (CMOS) devices.

Figure 3:
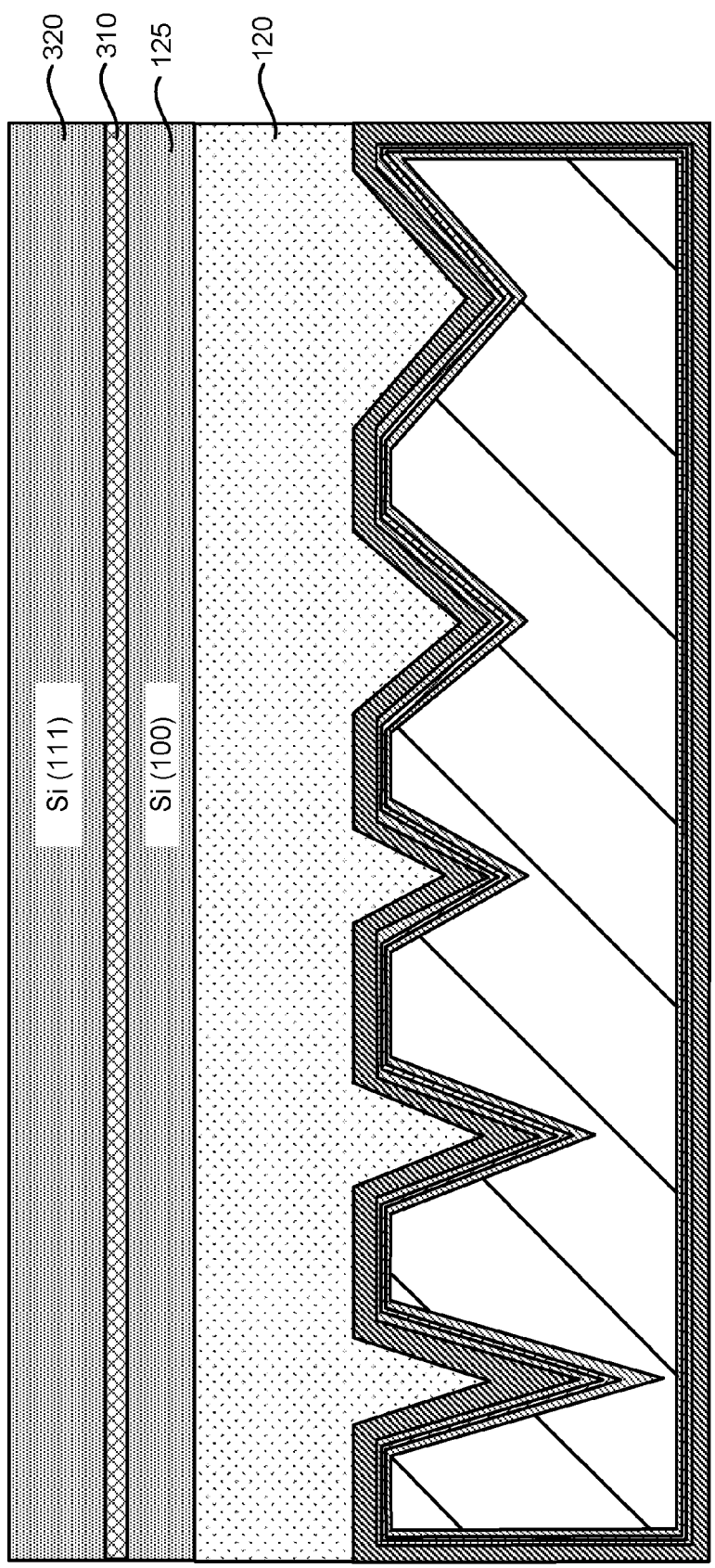
FIG. 3 is a schematic cross-sectional diagram illustrating an intermediate step of fabricating a semiconductor structure according to an embodiment of the present invention.

The method 200 may further include, at 206, forming a dielectric layer 310 coupled to the first silicon layer 125, as illustrated in FIG. 3. The dielectric layer 310 can be a high quality thermal oxide, or the like. The dielectric layer 310 may be formed by one of several deposition methods, such as LPCVD, PECVD or sputter oxides, LPCVD or PECVD nitrides of various stoichiometries, spin on dielectrics or glasses such as BPSG. One of ordinary skill in the art would recognize many variations, alternatives, and modifications. The dielectric layer 310 may have a thickness ranging from about 10 nm to about 20 nm according to some embodiments. The method 200 may further include, at 208, forming a second silicon layer 320 coupled to the dielectric layer 310, as illustrated in FIG. 3. The second silicon layer 320 may be substantially single crystalline, and having a surface in a second crystalline orientation different from the first crystalline orientation of the first silicon layer. For example, the second crystalline orientation can be the (111) orientation of silicon. The second silicon layer 320 can be formed by a layer transfer process in which a single crystal silicon layer is transferred from a silicon wafer, as described above. In some embodiments, the second silicon layer 320 (e.g., the (111) silicon layer) may be thickened by epitaxial growth as needed. In one embodiment, the second silicon layer 320 has a thickness of about 5 μm. The Si (111) layer is suitable for use as a growth layer during an epitaxial growth process for the formation of gallium nitride (GaN) based devices.

Figure 4:
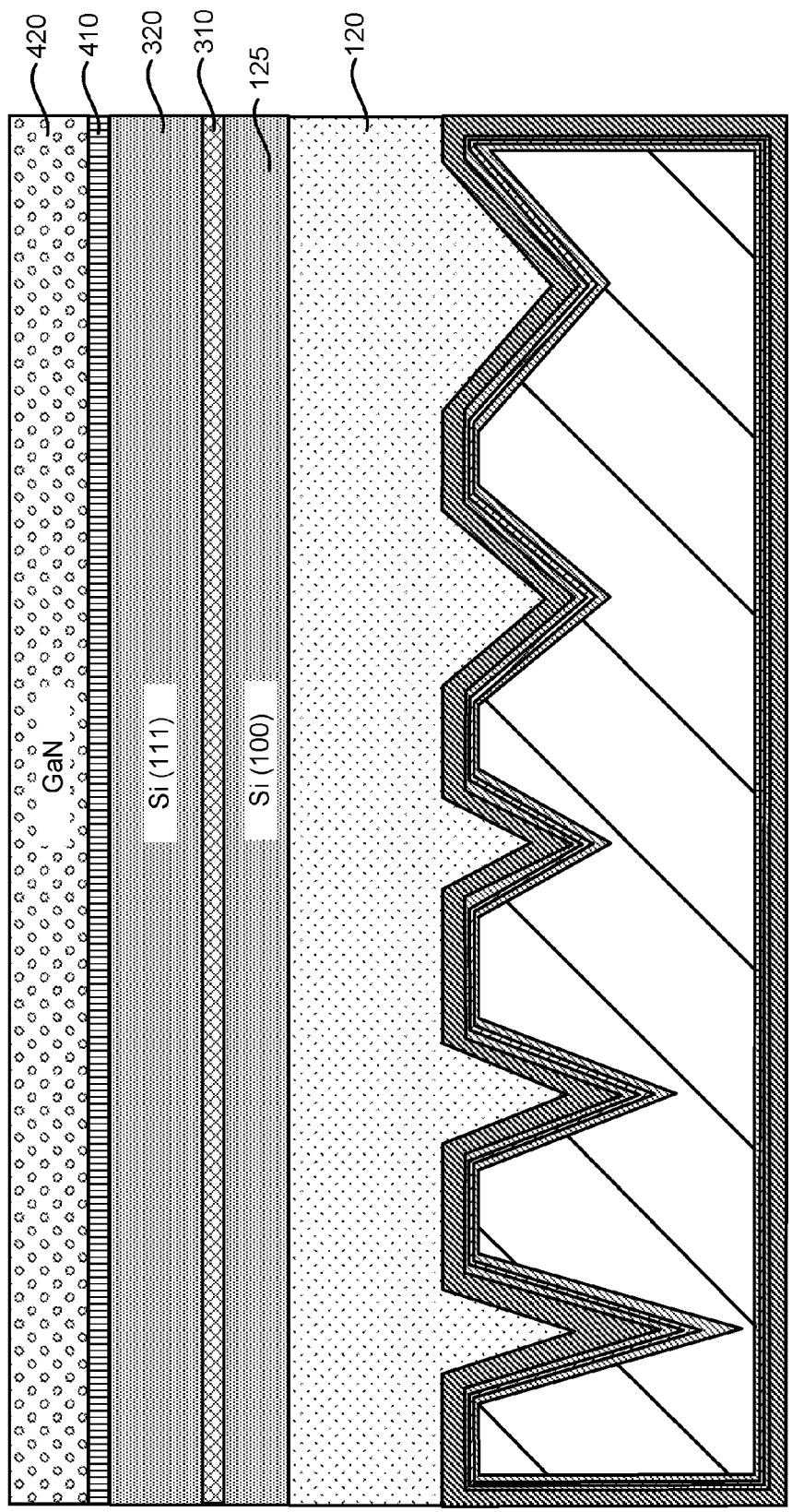
FIG. 4 is a schematic cross-sectional diagram illustrating an intermediate step of fabricating a semiconductor structure according to an embodiment of the present invention.
Figure 5:
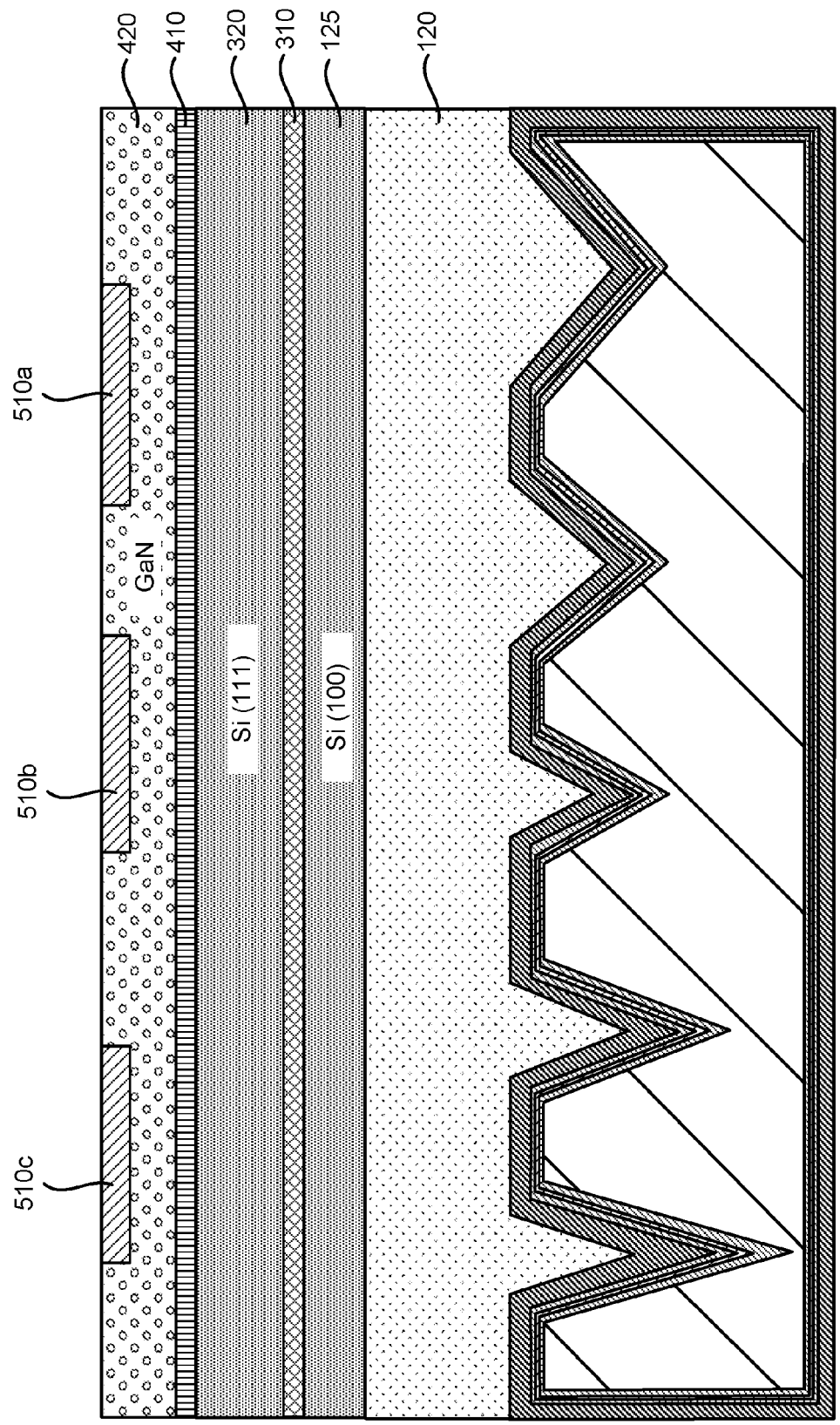
FIG. 5 is a schematic cross-sectional diagram illustrating an intermediate step of fabricating a semiconductor structure according to an embodiment of the present invention.

The method 200 may further include, at 210, forming a gallium nitride (GaN) layer 420 coupled to the second silicon layer 320 by epitaxial growth, as illustrated in FIG. 4. In some embodiments, a GaN buffer layer 410 is first gown on the Si (111) layer 320, before a thicker GaN layer 420 is grown. In some embodiments, the GaN layer 420 may have a thickness of about 5 μm. The method 200 may further include, at 212, forming one or more gallium nitride (GaN) based devices 510a-510c coupled to the GaN layer 420 by epitaxial growth, as illustrated in FIG. 5.

Figure 6:
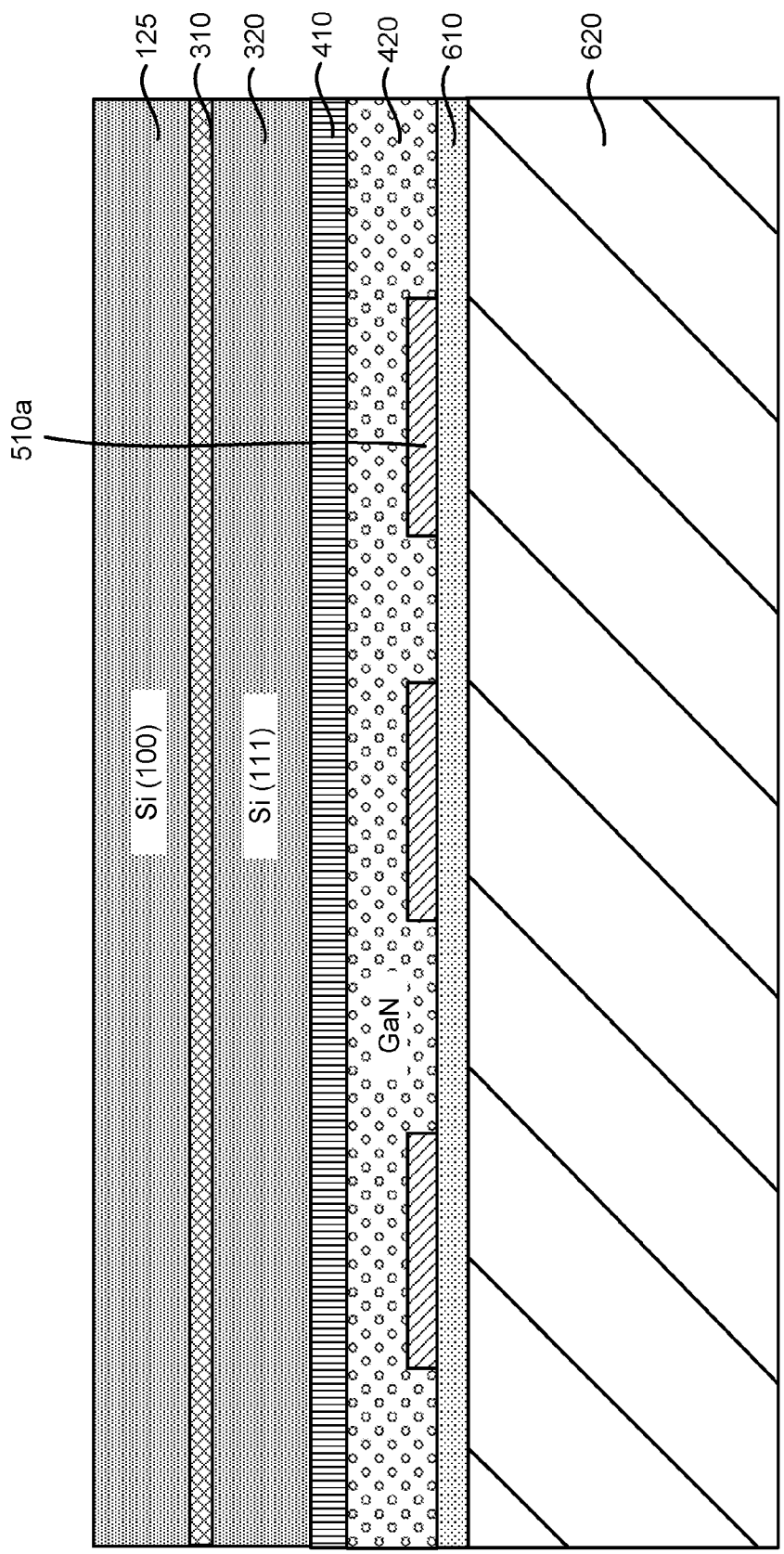
FIG. 6 is a schematic cross-sectional diagram illustrating an intermediate step of fabricating a semiconductor structure according to an embodiment of the present invention.
Figure 7:
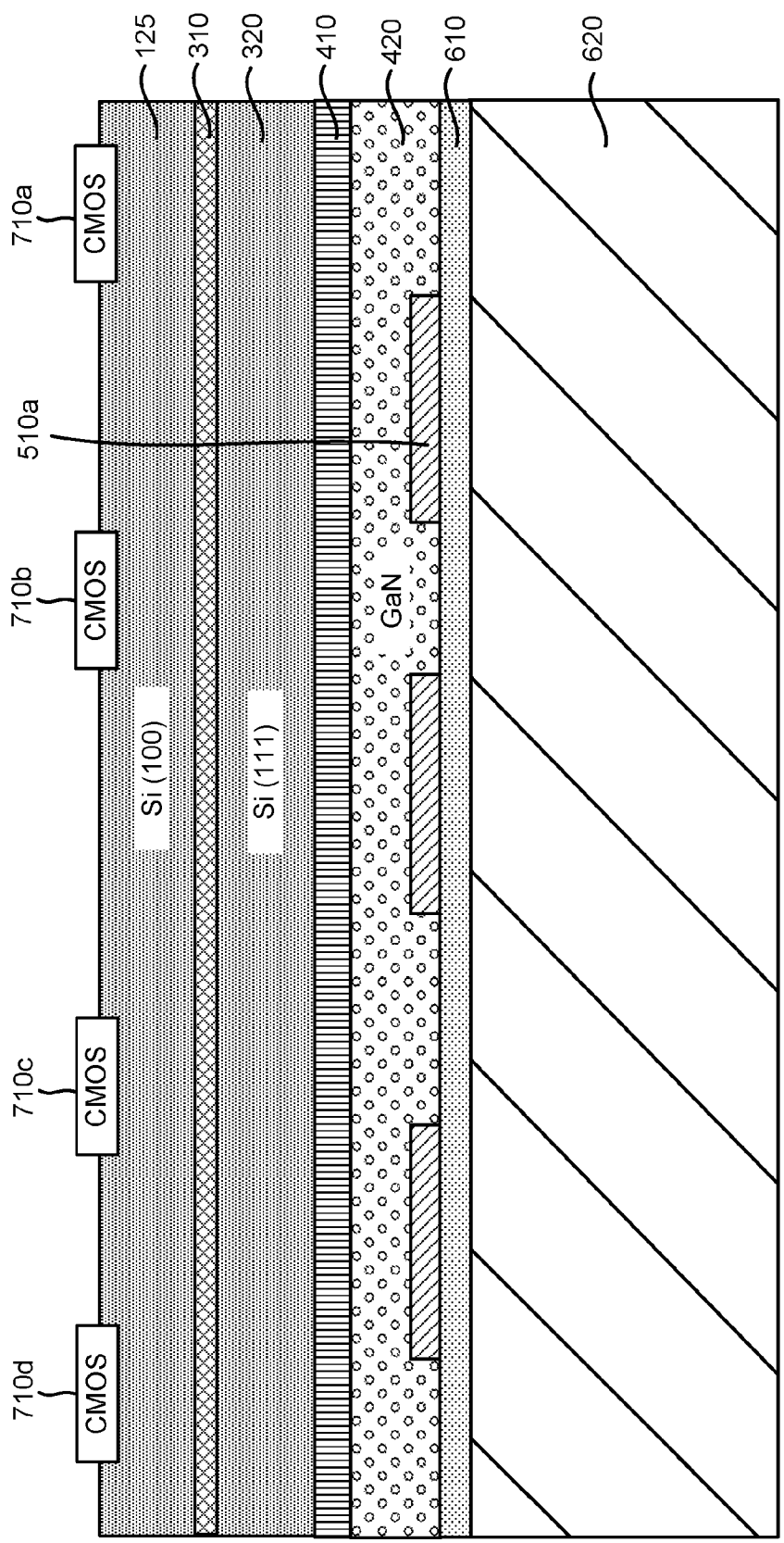
FIG. 7 is a schematic cross-sectional diagram illustrating an intermediate step of fabricating a semiconductor structure according to an embodiment of the present invention.

The method 200 may further include, at 214, removing the engineered substrate to expose a back surface of the first silicon layer 125. As illustrated in FIG. 6, the existing structure may be flipped upside down and attached to a carrier wafer 620 by a temporary adhesive 610. Then the engineered substrate is removed. The resulting structure has the back surface of the first silicon layer 125 (e.g., the Si (100) layer) facing up, so that devices may be formed thereon. The method 200 may further include, at 216, forming one or more silicon based devices 710a-710d, such as complementary metal-oxide-semiconductor (CMOS) devices, coupled to the back surface of the first silicon layer 125. Thus the resulting structure has silicon based devices 710a-710d on one side, and GaN based devices 510 on the opposite side. To make vertical interconnects between the silicon based devices 710a-710d and the GaN based devices 510, vias may be formed in the structure as described below. The GaN based devices 510 may include LEDs, power devices, or the like. The silicon based devices 710 may include driving circuits and controller logics for driving the LEDs or power devices.

Figure 8:
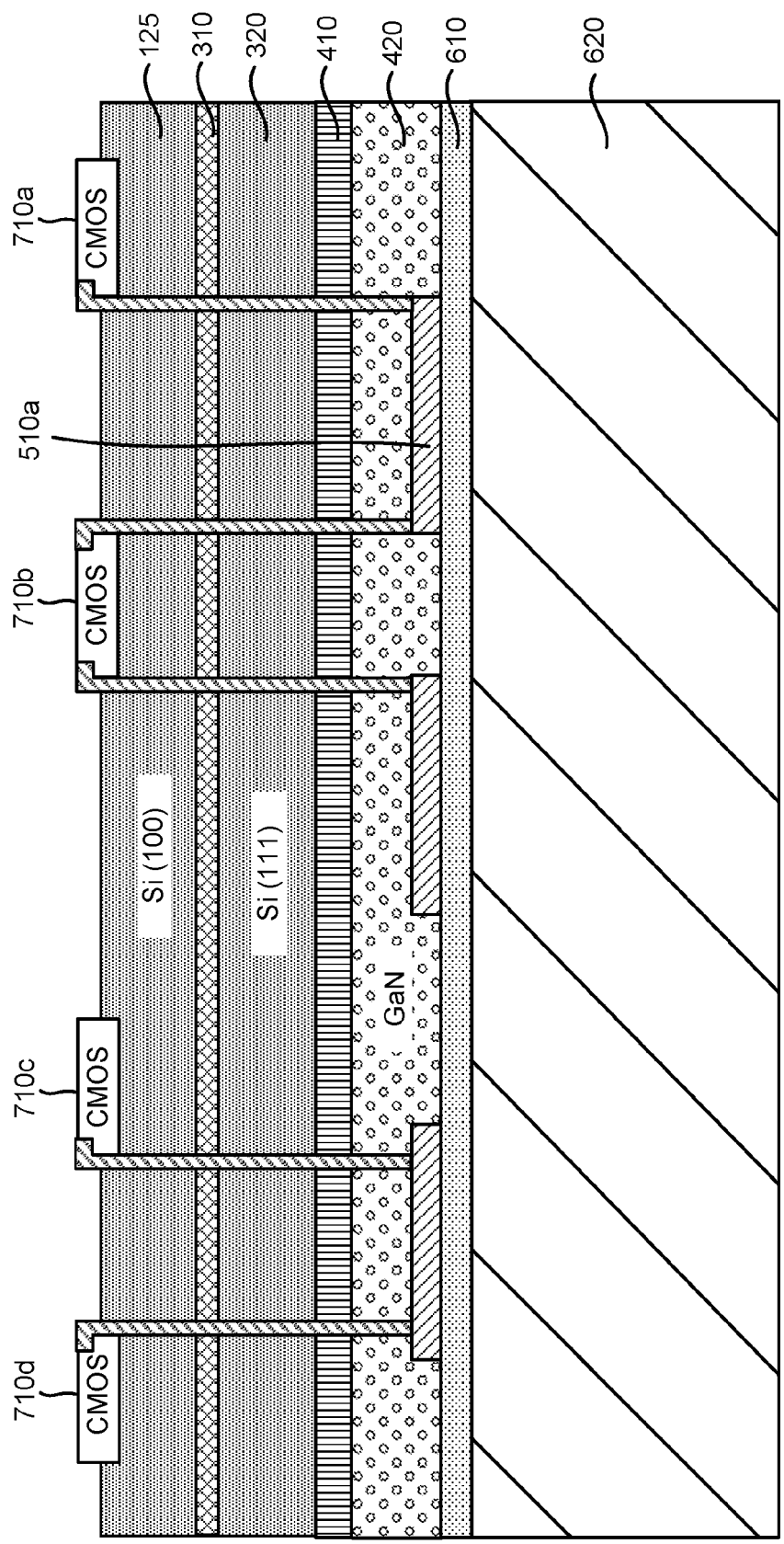
FIG. 8 is a schematic cross-sectional diagram illustrating an intermediate step of fabricating a semiconductor structure according to an embodiment of the present invention.

The method 200 may further include, at 218, forming one or more vias 810 from the back surface of the first silicon layer 125 (e.g., the Si (100) layer), as illustrated in FIG. 8. Each via 810 runs through the first silicon layer 125, the dielectric layer 310, the second silicon layer 320 (e.g., the Si (111) layer), and the GaN layer 420, and stops at a GaN based device 510. The method 200 may further include, at 220, filling the vias 810 with a conducting material. In some embodiments, the vias 810 may be filled with a refractory metal, such as W, Ti, Ta, or the like with increased thermal stability. In other embodiments, the vias 810 may be filled with other metals, such as Cu. The method 200 may further include, at 222, making additional interconnects to connect the silicon based devices 710 with the GaN based devices 510. The via formation procedures described above may be referred to as the "via last" technology. In the via last technology, vias are formed after the devices have been formed. In such cases, incompatibility of front end processing with metal based via processing may be avoided.

A via may be defined as a vertical and high aspect ratio cavity that is generally dry etched into a substrate using deep reactive etching. Filling of a via may involve several steps. First, a dielectric liner may be formed in the via. The dielectric liner may prevent electrical conduction to the substrate. After the liner deposition, a diffusion barrier (barrier) layer may be deposited to prevent the conductive via material from migrating out of the trench and into the substrate. Then a seed layer and/or an adhesion layer may be deposited over the dielectric liner and the diffusion barrier layer. The seed layer and the adhesion layer may be the same or different layer materials. The seed layer and the adhesion layer may serve the purpose of allowing for a well adhered nucleation layer for the subsequent plating or electrodeposition of a metal into the via. Given the high aspect ratio of the via (e.g., about 10:1 up to 50:1), the dielectric liner, barrier layer, adhesion layer and seed layer can be relatively thin (e.g., a few nanometers). The plated or electrodeposited via material may be Cu, W, or similar conductive material that fills the via and provides for the electrical connectivity through the substrate.

According to the method 200, GaN based devices are vertically integrated with silicon based devices through the vias. Compared to lateral integration where GaN based devices and silicon based devices are integrated on the same side of the wafer, vertical integration may afford more compact layout and smaller packages.

It should be appreciated that the specific steps illustrated in FIG. 2 provide a particular method of fabricating a semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 9:
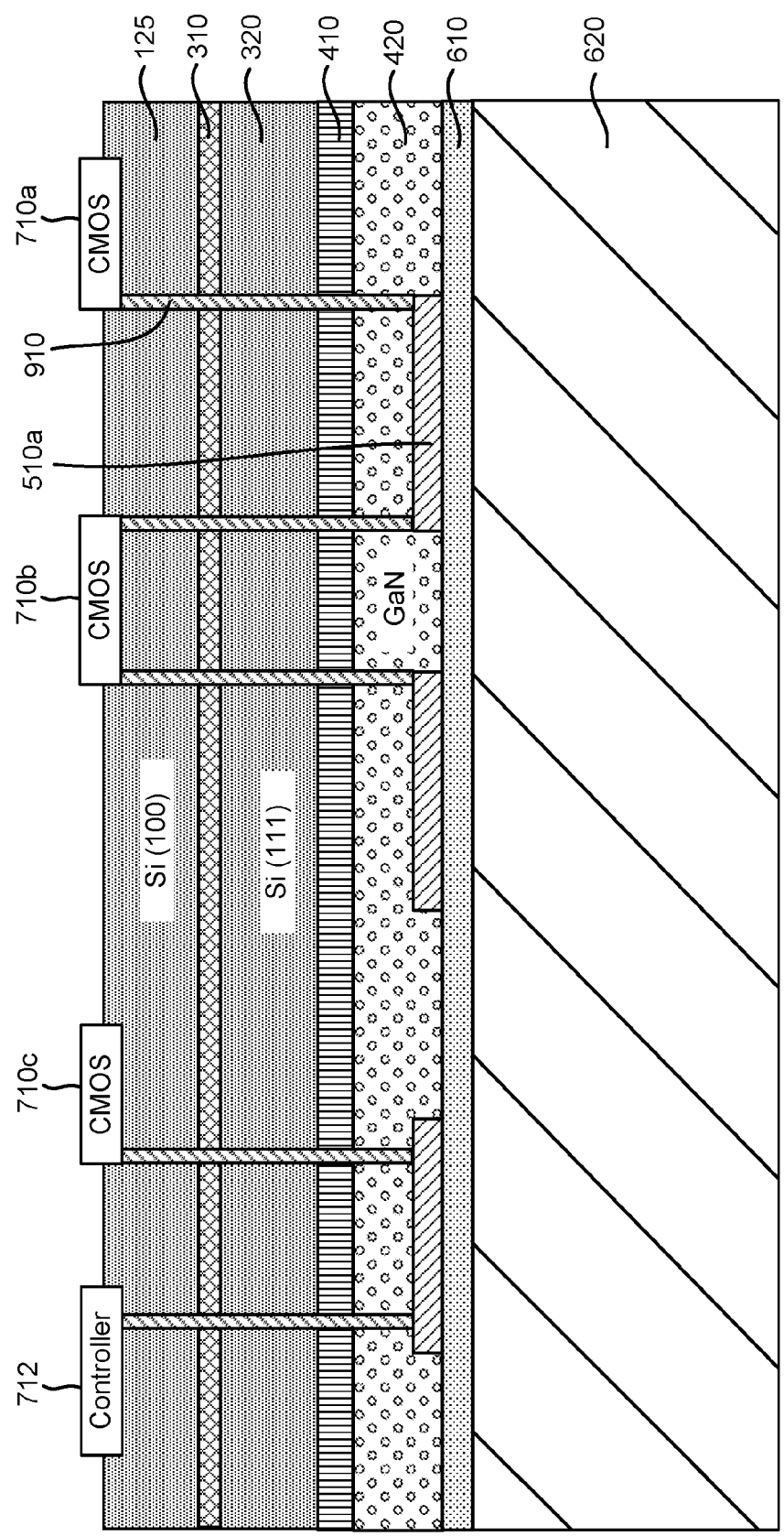
FIG. 9 is a schematic cross-sectional diagram illustrating an intermediate step of fabricating a semiconductor structure according to an embodiment of the present invention.

FIG. 9 illustrates another embodiment, the vias 910 are formed and filled with a conductive material before the silicon based devices 710 (e.g., CMOS devices) are formed but after the GaN based devices 510 are formed. Such via formation procedures may be referred to as the "via middle" technology. Since the high temperature processing of the GaN based devices is done before the vias are formed, the vias may be filled with a low temperature conductive material, such as Cu. After the vias 910 have been formed and filled, the silicon based devices 710 are formed. The silicon based devices 710 may be fabricated such that appropriate interconnects with the GaN devices 510 are made through the vias 910. In such cases, the step 220 may not be needed as the silicon based devices 710 are already interconnected with the GaN based devices 510 when they are formed. In some embodiments, a controller circuit or logic circuit 712 may be formed on the first silicon layer 125 for controlling a die as will be discussed further below.

Figure 10:
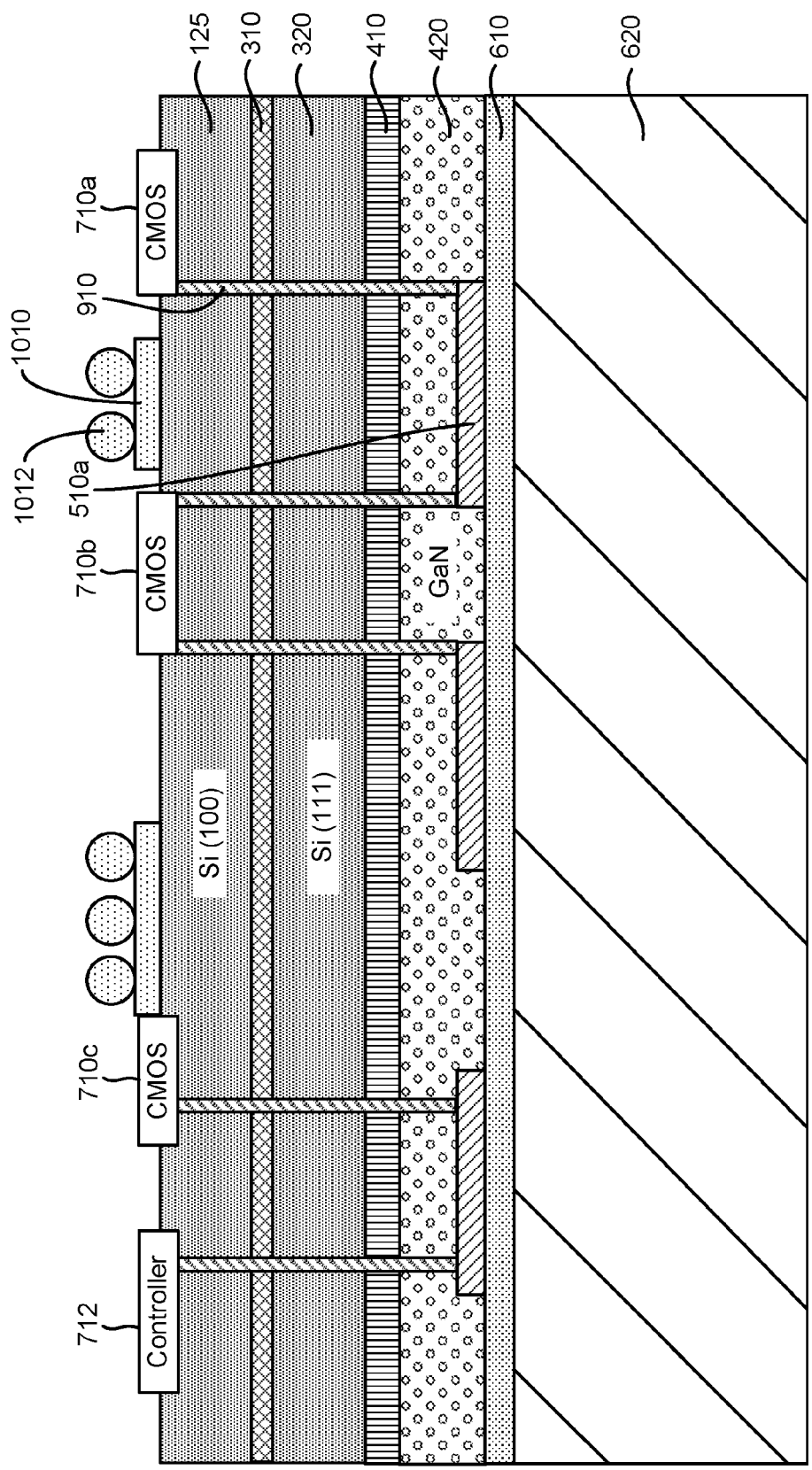
FIG. 10 is a schematic cross-sectional diagram illustrating an intermediate step of fabricating a semiconductor structure according to an embodiment of the present invention.
Figure 11:
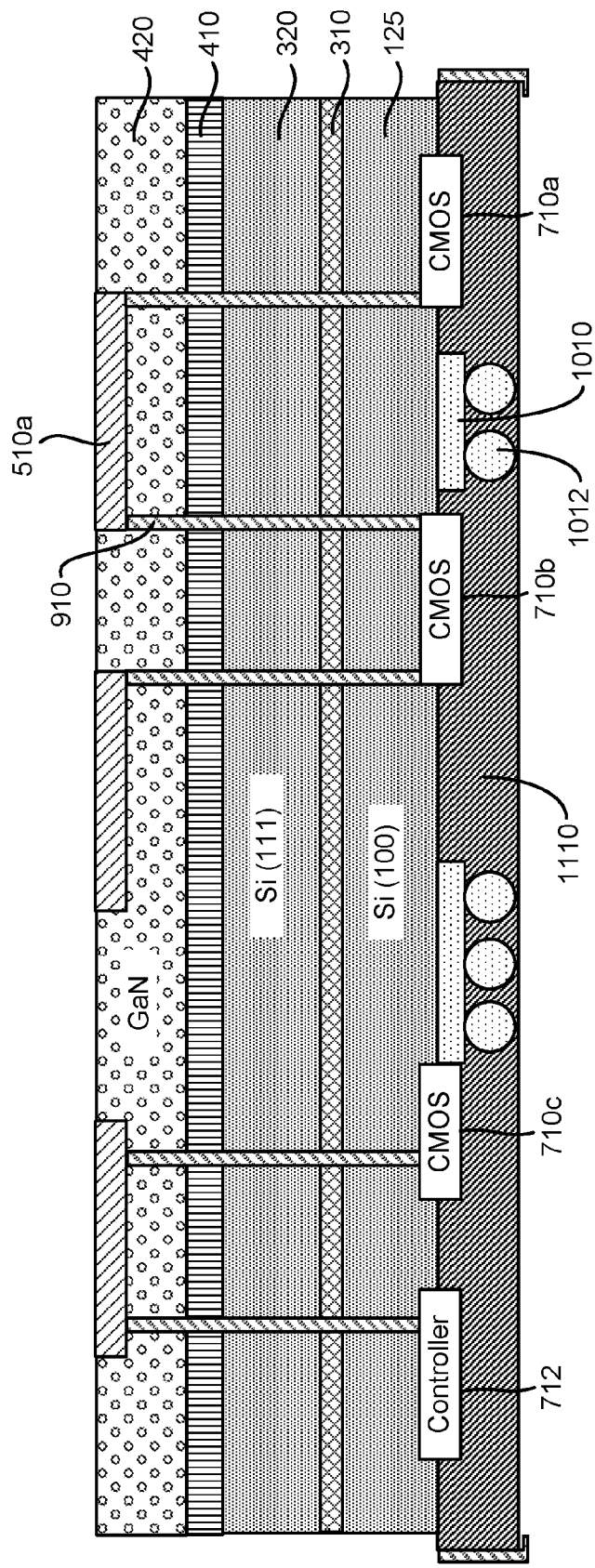
FIG. 11 is a schematic cross-sectional diagram illustrating an intermediate step of fabricating a semiconductor structure according to an embodiment of the present invention.
Figure 12:
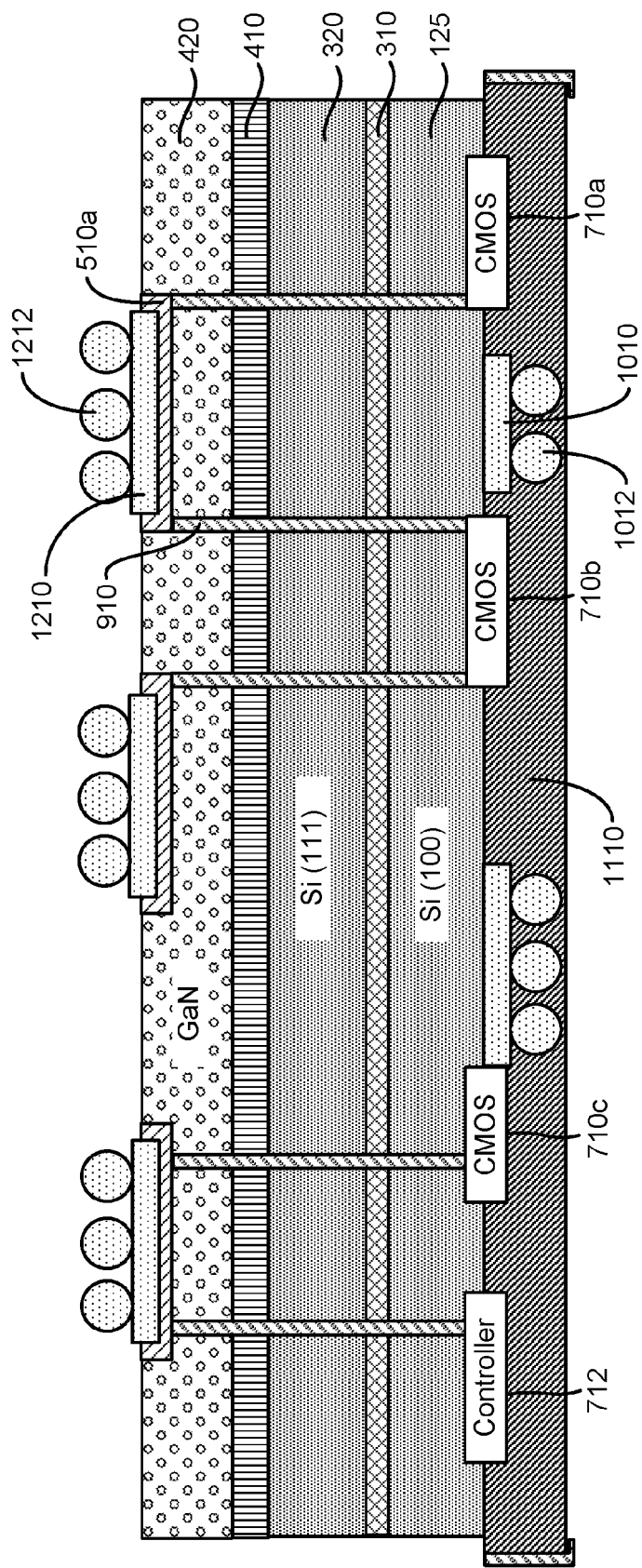
FIG. 12 is a schematic cross-sectional diagram illustrating an intermediate step of fabricating a semiconductor structure according to an embodiment of the present invention.
Figure 13:
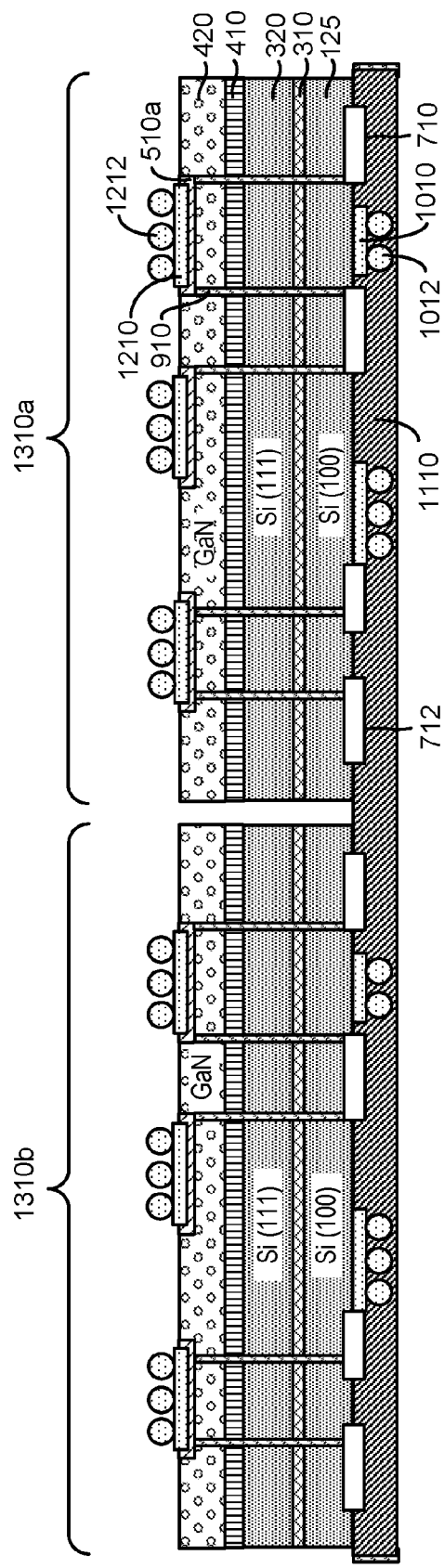
FIG. 13 is a schematic cross-sectional diagram illustrating an intermediate step of fabricating a semiconductor structure according to an embodiment of the present invention.
Figure 14:
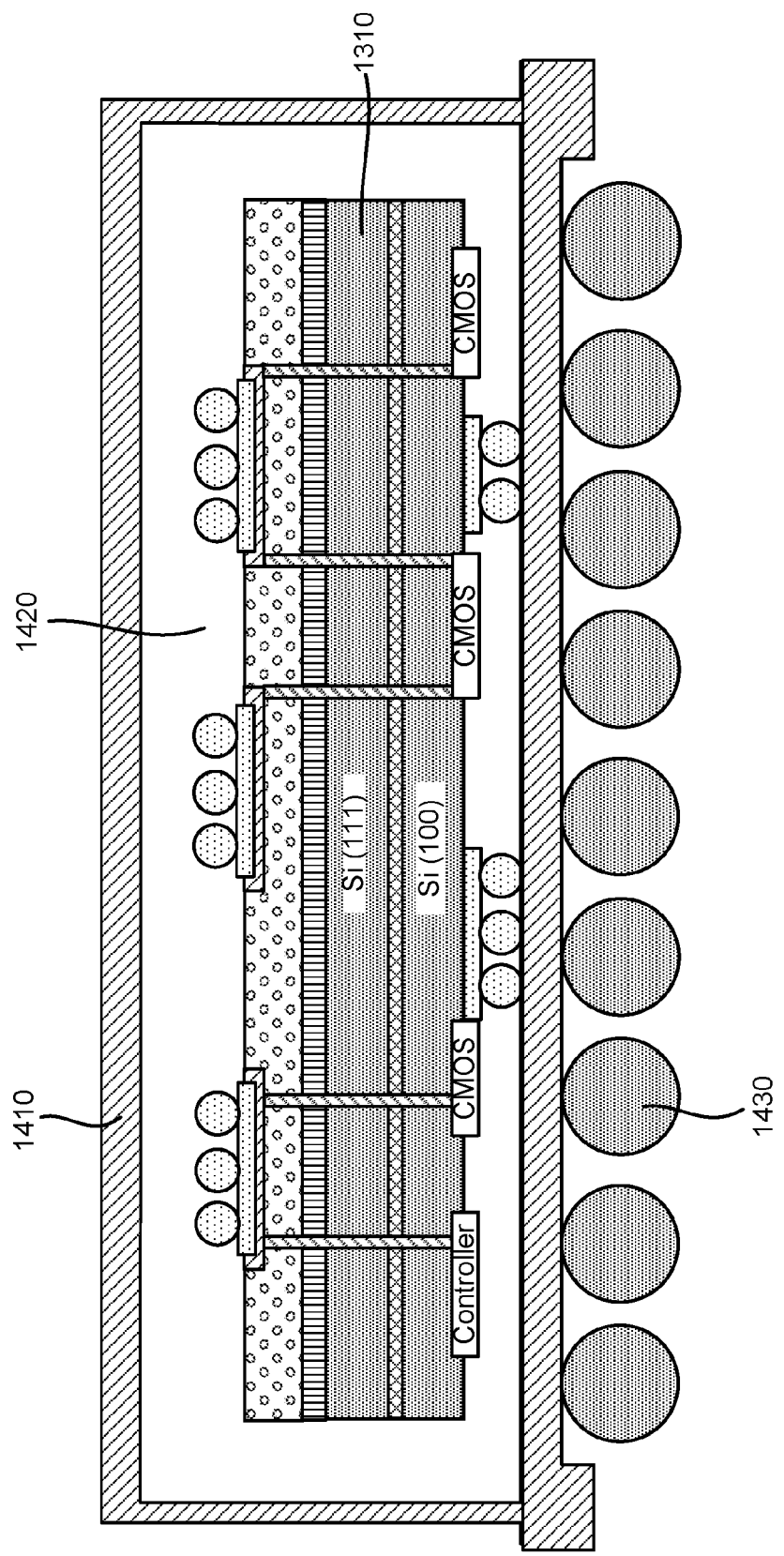
FIG. 14 is a schematic cross-sectional diagram illustrating an intermediate step of fabricating a semiconductor structure according to an embodiment of the present invention.
Figure 15:
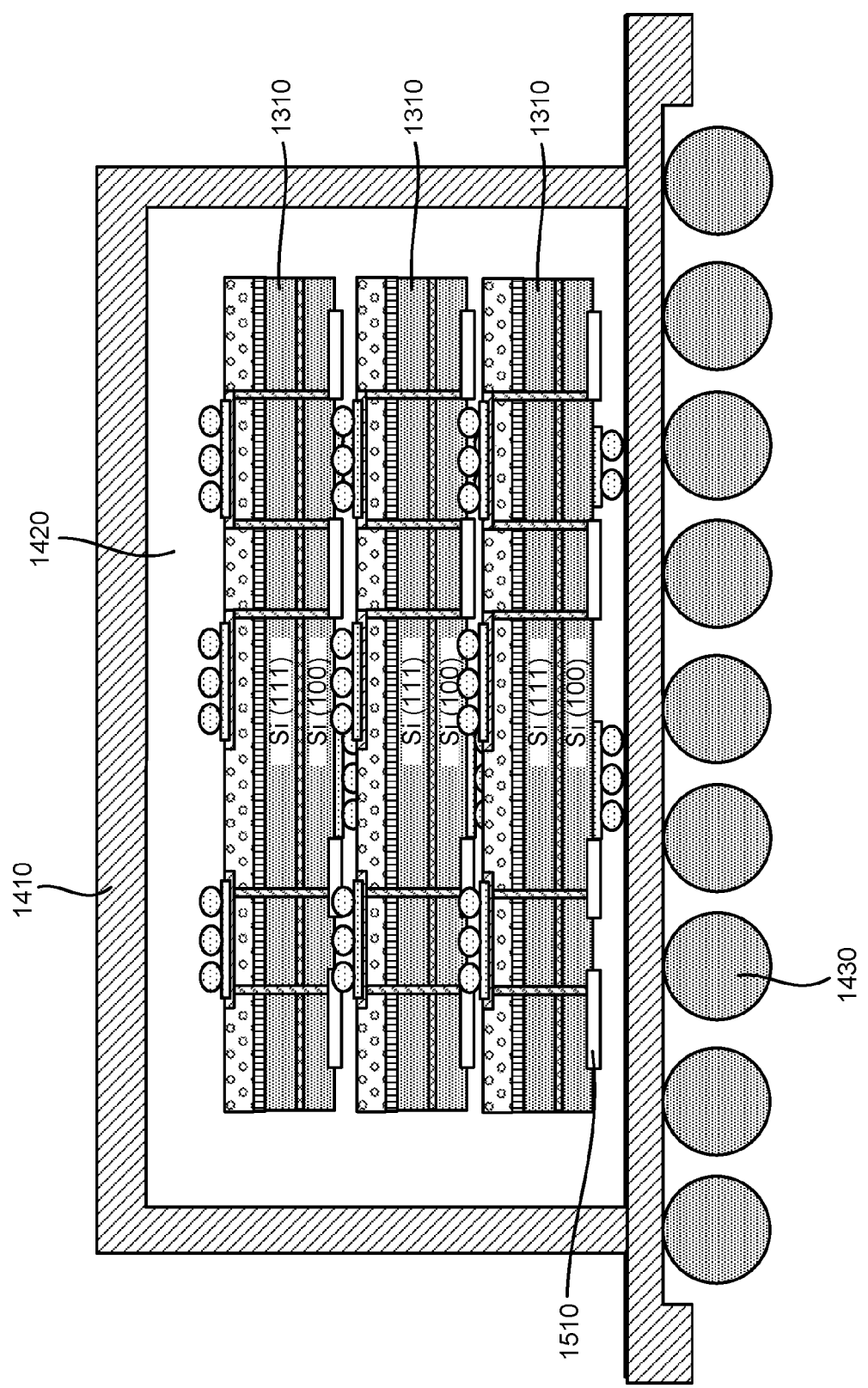
FIG. 15 is a schematic cross-sectional diagram illustrating an intermediate step of fabricating a semiconductor structure according to an embodiment of the present invention.

FIGS. 10-15 illustrates optional packaging steps. As illustrated in FIG. 10, backend redistribution (RDL) pads 1010 and solder balls 1012 may be formed on the first silicon layer 125 (e.g., the Si (100) layer). As illustrated in FIG. 11, the stack is flipped upside down and attached to a film frame 1110. Then the carrier wafer 620 is removed. As illustrated in FIG. 12, front side RDL pads 1210 and solder balls 1212 may be formed on the GaN based devices 510 for three-dimensional (3D) stacking of completed integrated devices. As illustrated in FIG. 13, the structure may be diced to form a plurality of dies 1310*a* and 1310*b*. FIG. 14 illustrates a finished package where a die 1310 is enclosed in a packaging 1410 according to one embodiment. FIG. 15 illustrates a finished package where a plurality of dies 1310*a*-1310*c* are stacked vertically (3D stacking) according to some embodiments. The package may include a controller circuit or logic circuit 1510 in one of the dies 1310*c* for controlling the plurality of dies 1310*a*-1310*c*. Underfilling is a final step in packaging before encapsulation. Underfill 1420 may be used to fill the space inside the package and adsorb shock from outside the package (e.g. when the package is dropped) to prevent damage of the delicate die 1310. The underfill 1420 can also facilitate thermal heat transfer from the die 1310 to the packaging 1410 to prevent overheating of the devices during operation. The underfill 1420 is generally a polymer that is applied to the die stack and covers the surfaces and stacked die interlayers by capillary action (so called capillary underfill).

Figure 16:
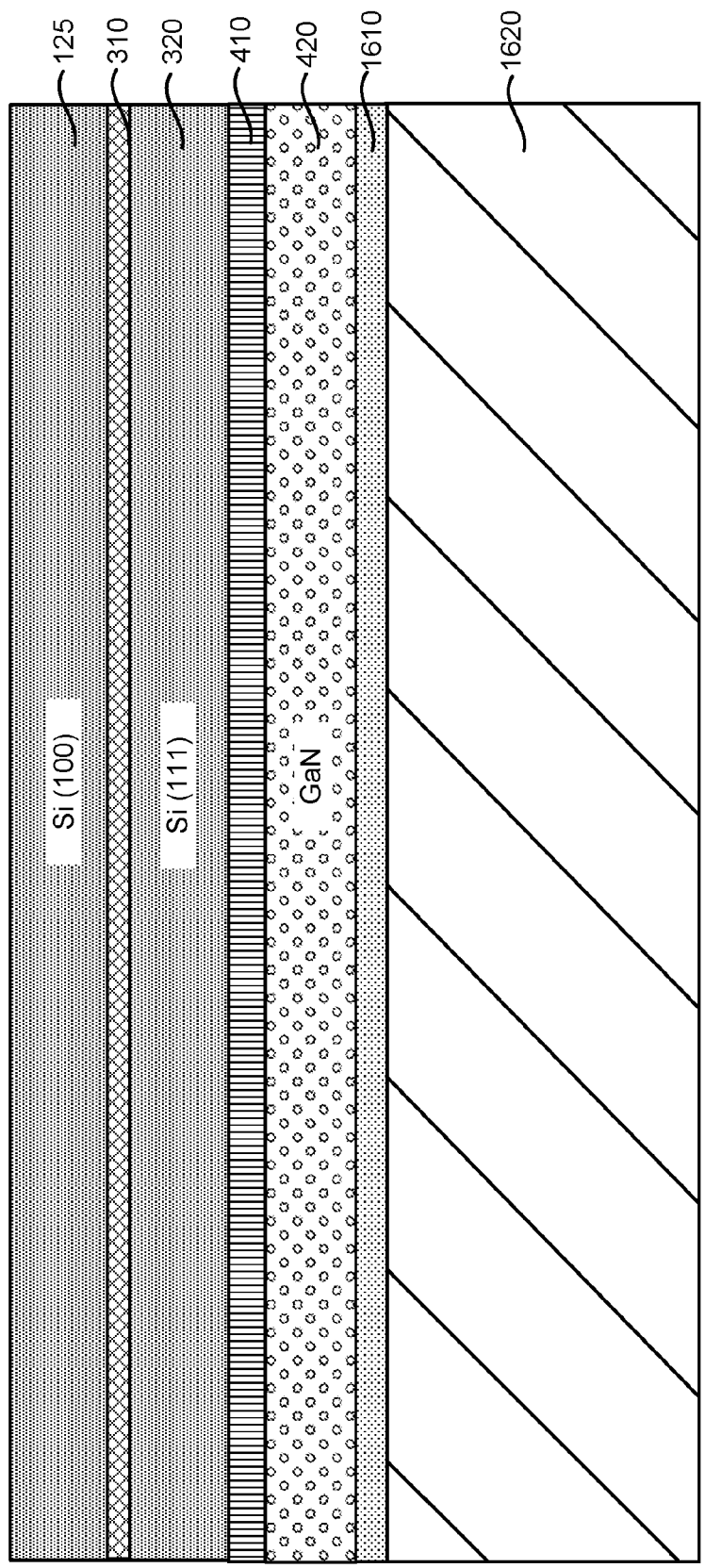
FIG. 16 is a schematic cross-sectional diagram illustrating an intermediate step of fabricating a semiconductor structure according to an embodiment of the present invention.
Figure 17:
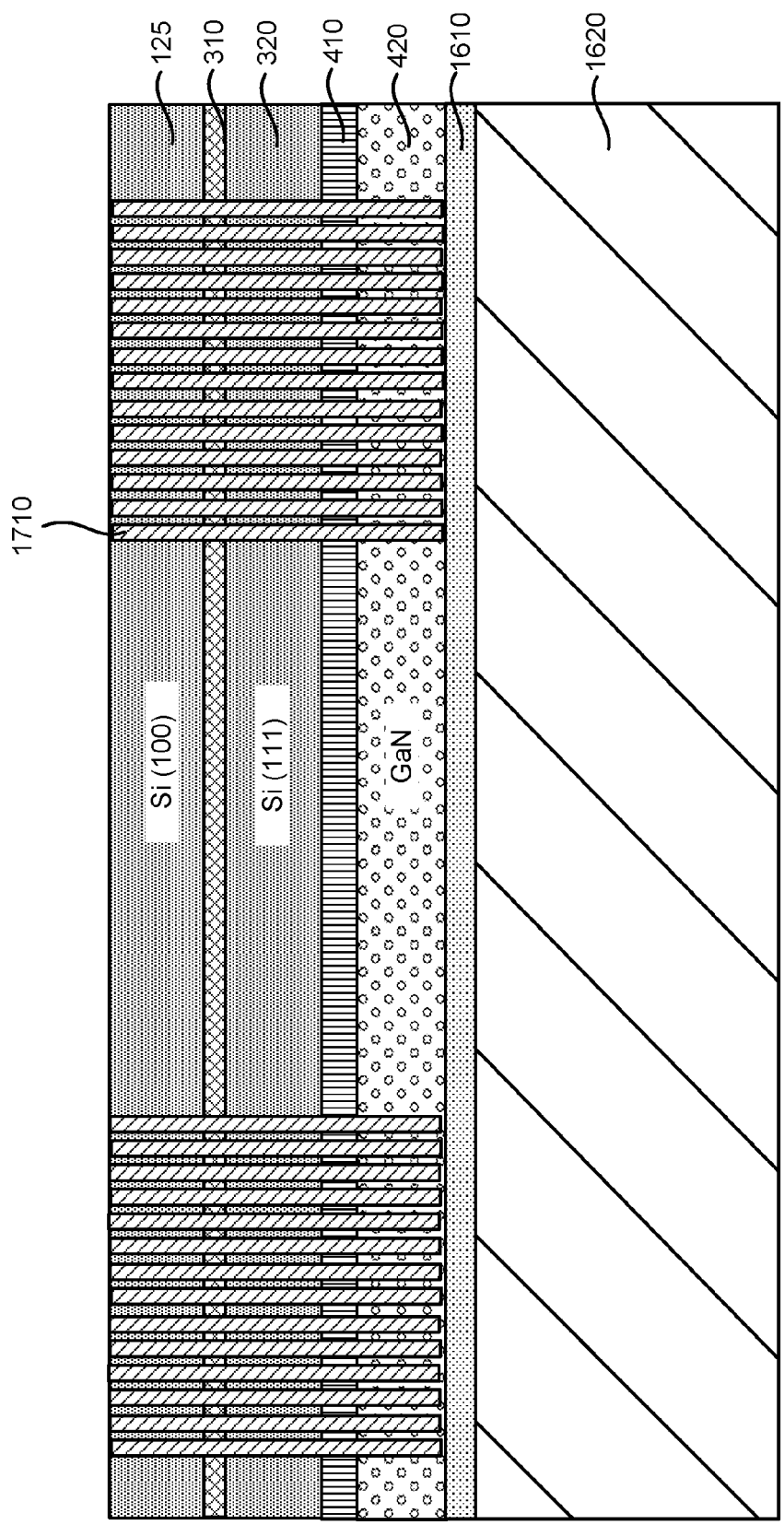
FIG. 17 is a schematic cross-sectional diagram illustrating an intermediate step of fabricating a semiconductor structure according to an embodiment of the present invention.

In alternative embodiments, after the GaN layer 420 has been grown on the exfoliated Si (111) layer 320 bonded to an engineered substrate, the structure may be attached to a temporary carrier wafer 1620 by a temporary adhesive 1610 and the engineered substrate may be removed to expose the exfoliated Si (100) layer 125, as illustrated in FIG. 16. An array of vias 1710 may be pre-formed from the exposed Si (100) layer 125, as illustrated in FIG. 17. The array of vias 1710 can be selectively accessed by users in subsequent device fabrication steps.

Figure 18A:
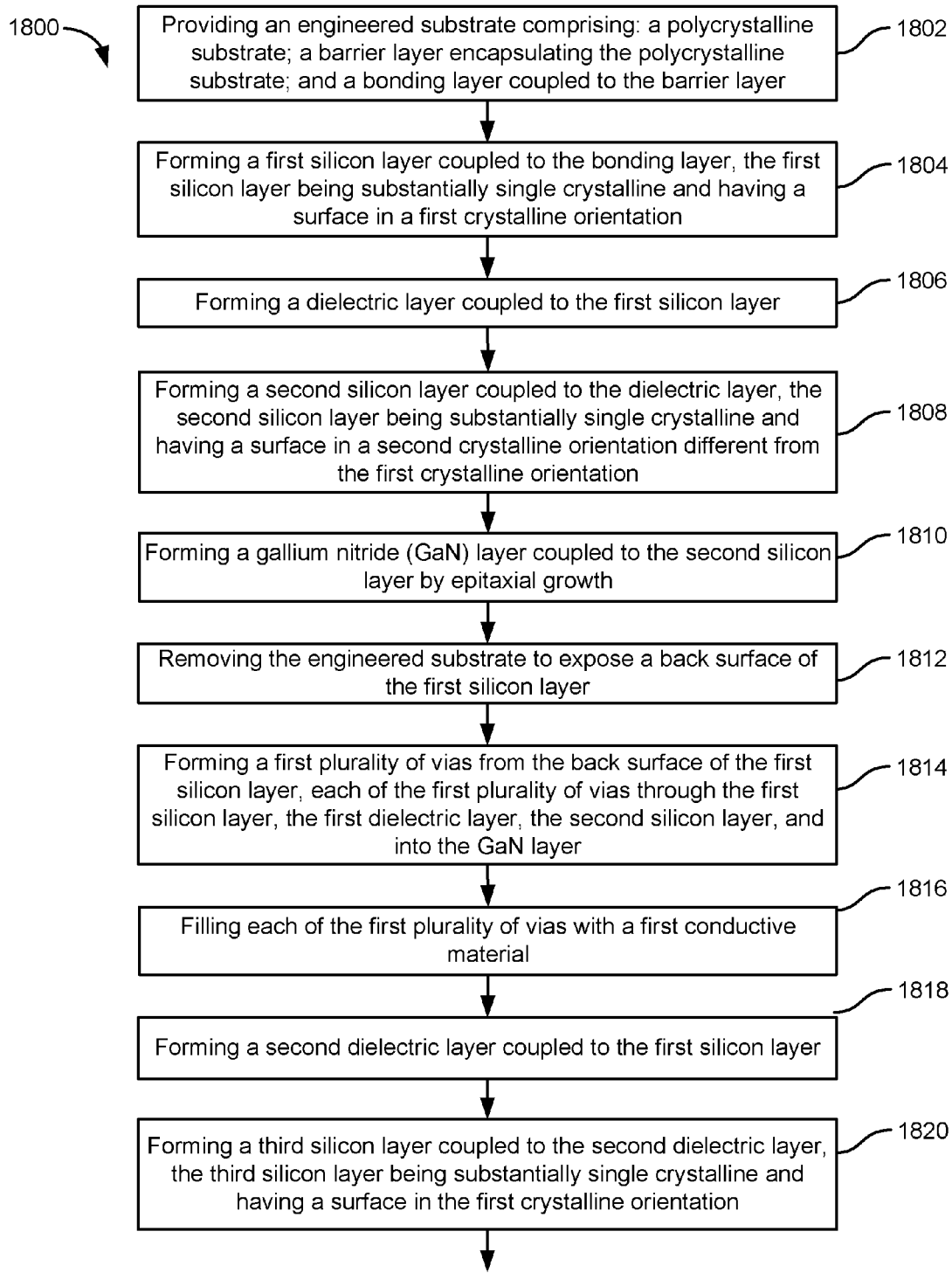
FIGS. 18A and 18B show a simplified flowchart illustrating a method of fabricating a semiconductor structure according to an embodiment of the present invention.
Figure 18B:
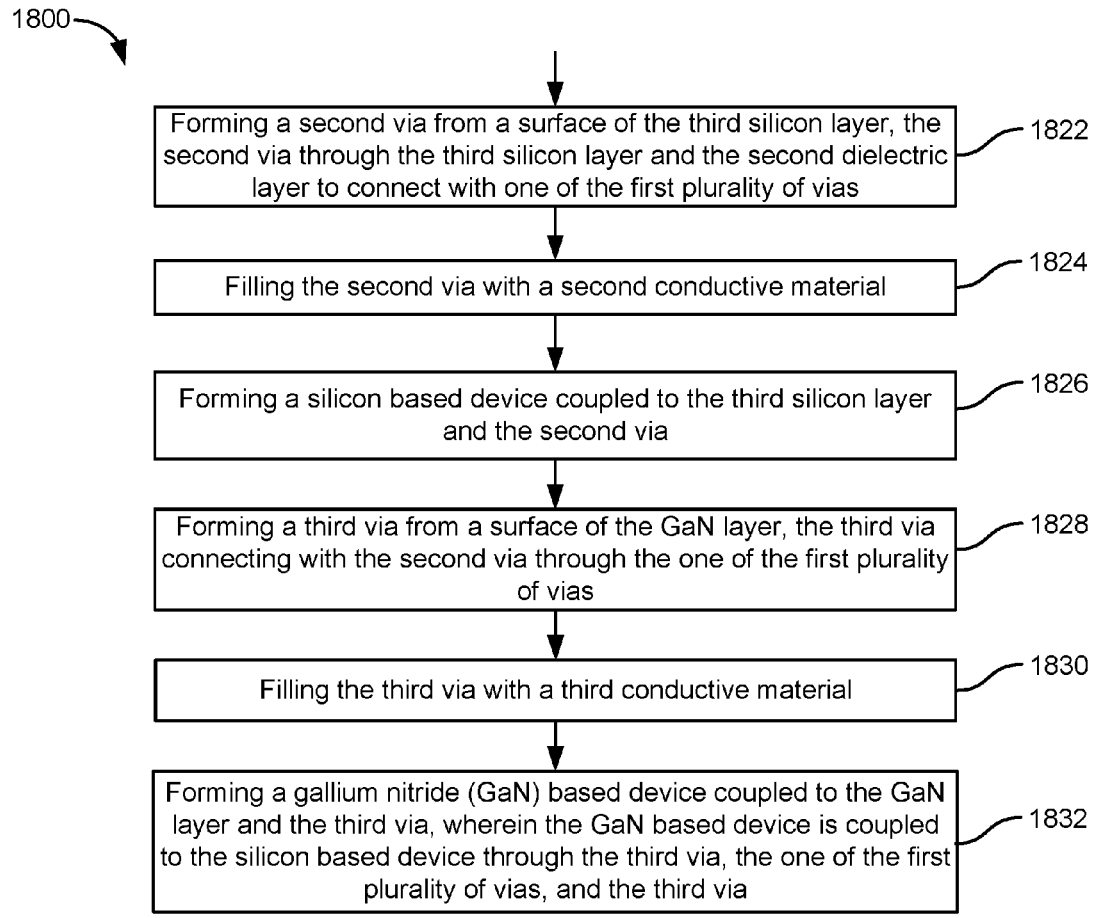

FIGS. 18A and 18B show a simplified flowchart illustrating a method 1800 of vertical integration of elemental and compound semiconductors according to another embodiment of the present invention. The method 1800 includes steps 1802-1812 that are substantially similar to steps 202-210 and 214 of the method 200, as described above. For example, the method 1800 include, at 1802, providing an engineered substrate. The engineered substrate includes a polycrystalline substrate, a barrier layer encapsulating the polycrystalline substrate, and a bonding layer coupled to the barrier layer. The engineered substrate may further include one or more adhesion layers (e.g., TEOS layers) and/or conductive layers (e.g., polycrystalline silicon layers), as described above.

The method 1800 further includes, at 1804, forming a first silicon layer 125 coupled to the bonding layer. The first silicon layer 125 can be substantially single crystalline and can have a surface in a first crystalline orientation (e.g., the Si (100) orientation). The method 1800 further includes, at 1806, forming a first dielectric layer 310 coupled to the first silicon layer 125, and at 1808, forming a second silicon layer 320 coupled to the first dielectric layer 310. The second silicon layer 320 can be substantially single crystalline and can have a surface in a second crystalline orientation different from the first crystalline orientation. For example, the second crystalline orientation may be the Si (111) orientation. The Si (111) layer is suitable for use as a growth layer during an epitaxial growth process for the formation of gallium nitride (GaN) based devices.

The method 1800 further includes, at 1810, forming a gallium nitride (GaN) layer 420 coupled to the second silicon layer 320 by epitaxial growth. The resulting structure may be attached to a first carrier wafer 1620 by the temporary adhesive 1610, with the GaN layer 420 facing the first carrier wafer 1620 and the first silicon layer 125 (e.g., the Si (100) layer) facing up. The method 1800 may further includes, at 1812, removing the engineered substrate to expose a back surface of the first silicon layer 125. FIG. 16 illustrates the resulting structure after the step 1812 in one embodiment.

The method 1800 may further include, at 1814, forming a first plurality of vias 1710 from the back surface of the first silicon layer 125, as illustrated in FIG. 17. Each of the first plurality of vias 1710 runs through the first silicon layer 125, the first dielectric layer 310, the second silicon layer 320, and into the GaN layer 420. The method 1800 further includes, at 1816, filling each of the first plurality of vias 1710 with a conductive material. The process of via formation may include: defining the array using photolithography, performing etching to form the vias 1710, and lining the vias 1710 with a dielectric material, and filling the vias 1710 with a metal. This process may be referred to as the "via first" technology, where the vias 1710 are formed before the devices are formed or early in the device manufacturing flow. In such cases, the via filling material may be chosen to be compatible with subsequent device processing steps. For example, epitaxial GaN based devices are formed at relatively high temperatures. Thus, a high temperature metal, such as W, Ti, Ta, or the like, may be used for via filling. In some embodiments, the aspect ratio of the vias 1710 can be relative low. For example, each via 1710 may be less than 5 μm deep and about 10 μm to 20 μm wide, giving rise to an aspect ratio of about 1:2 or 1:4. In such cases, etching and filling of the vias 1710 may not be too complicated. The first plurality of vias 1710 may be selectively accessed in subsequent device processing steps, as described below.

Figure 19:
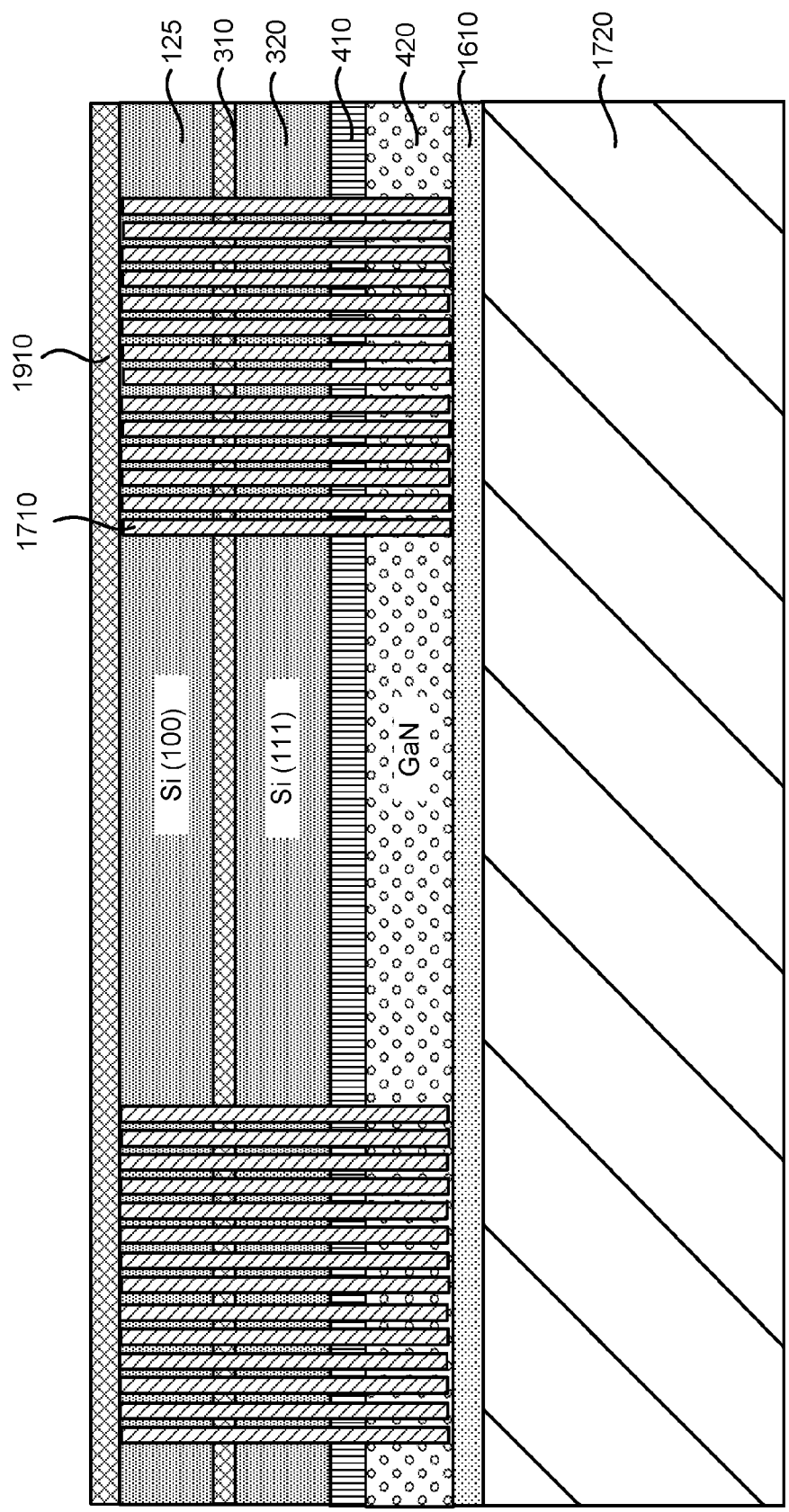
FIG. 19 is a schematic cross-sectional diagram illustrating an intermediate step of fabricating a semiconductor structure according to an embodiment of the present invention.
Figure 20:
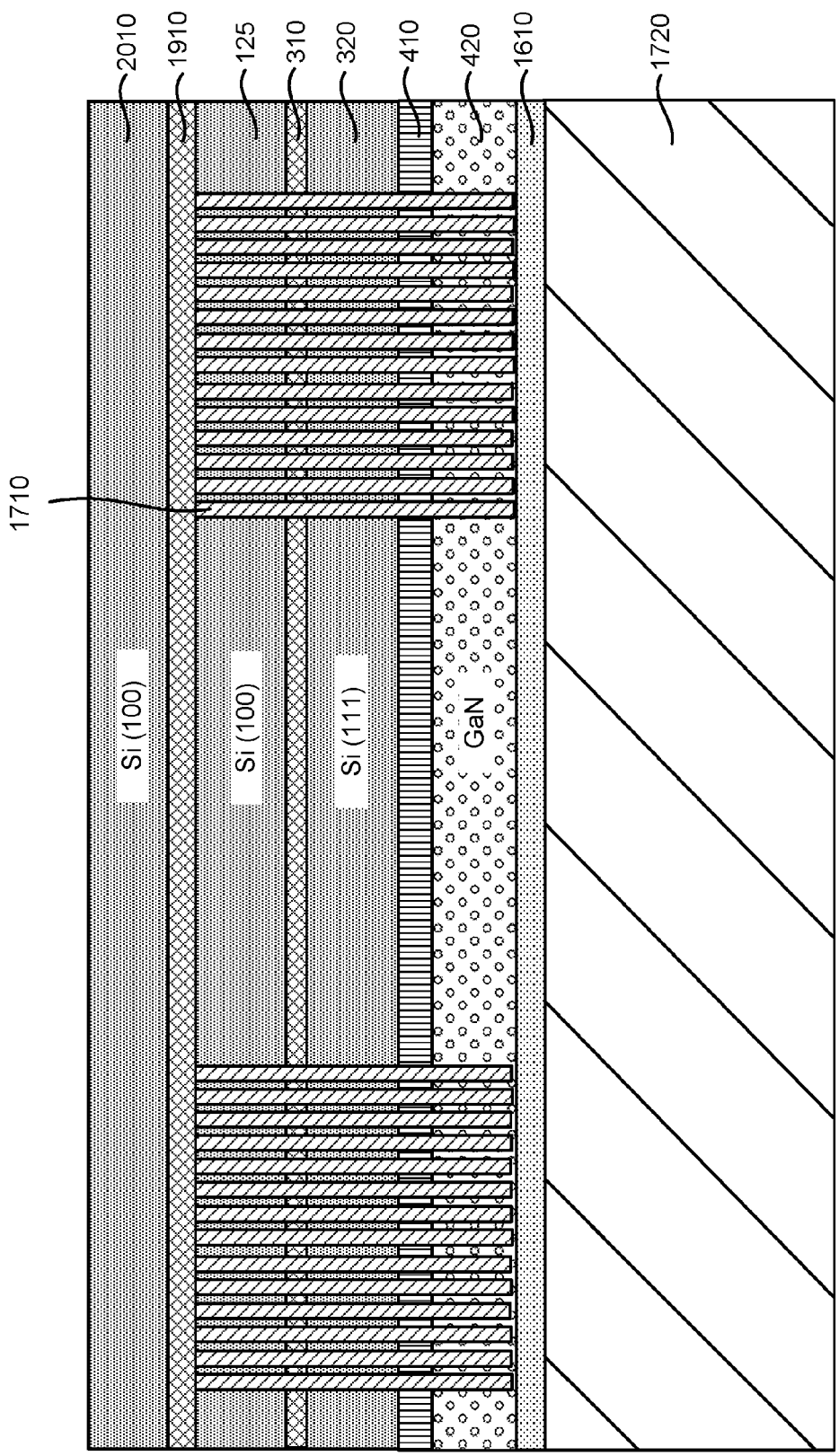
FIG. 20 is a schematic cross-sectional diagram illustrating an intermediate step of fabricating a semiconductor structure according to an embodiment of the present invention.

In one embodiment, the method 1800 may include, at 1818, forming a second dielectric layer 1910 coupled to the first silicon layer 125 (e.g., the Si (100) layer) as illustrated in FIG. 19, and at 1820, forming a third silicon layer 2010 coupled to the second dielectric layer 1910 as illustrated in FIG. 20. The third silicon layer 2010 can be substantially single crystalline and can have a surface in the first crystalline orientation, such as the Si (100) orientation. The first plurality of vias 1710 are buried under the second dielectric layer 1910 and the third silicon layer 2010.

Figure 21:
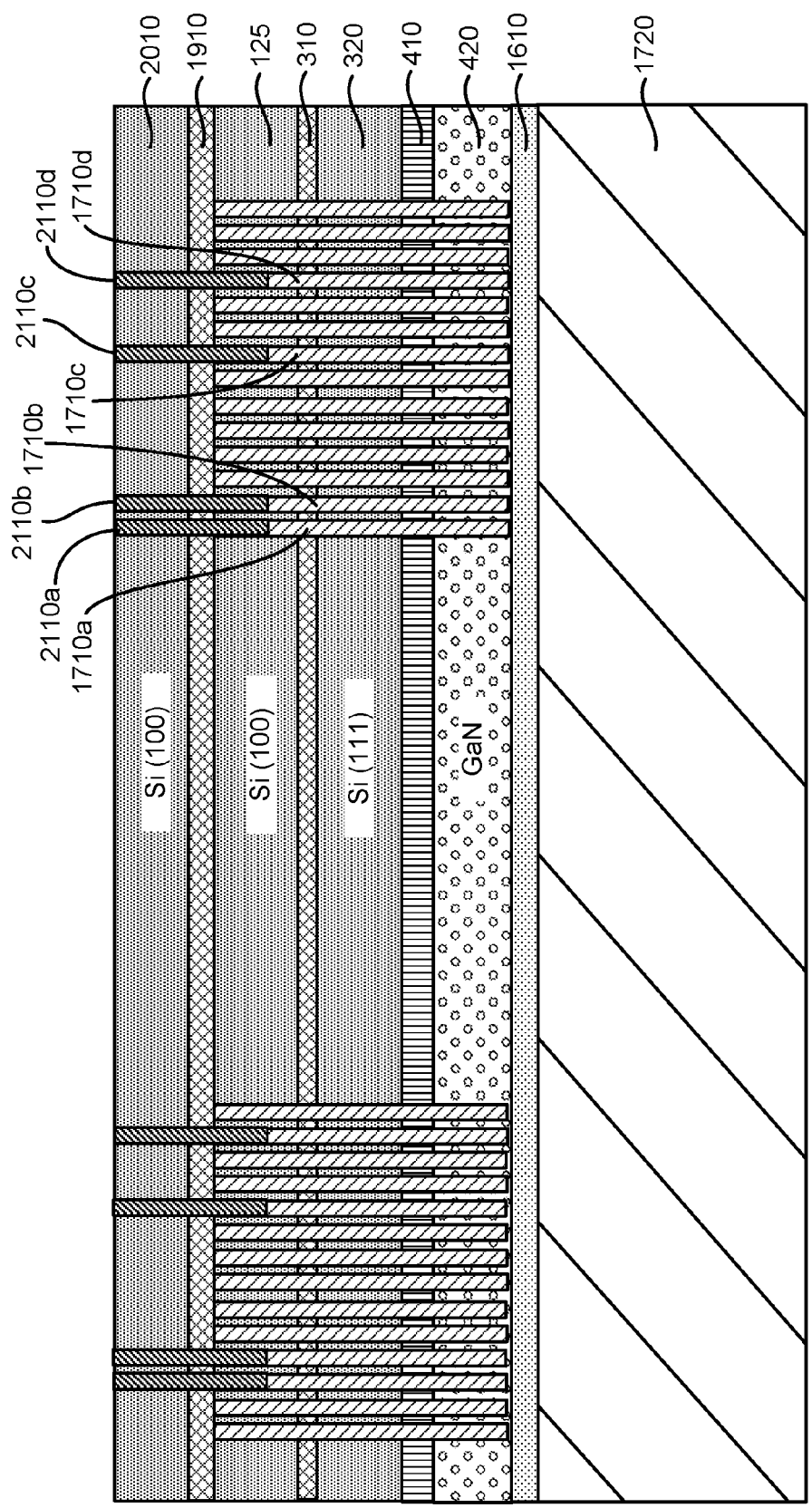
FIG. 21 is a schematic cross-sectional diagram illustrating an intermediate step of fabricating a semiconductor structure according to an embodiment of the present invention.
Figure 22:
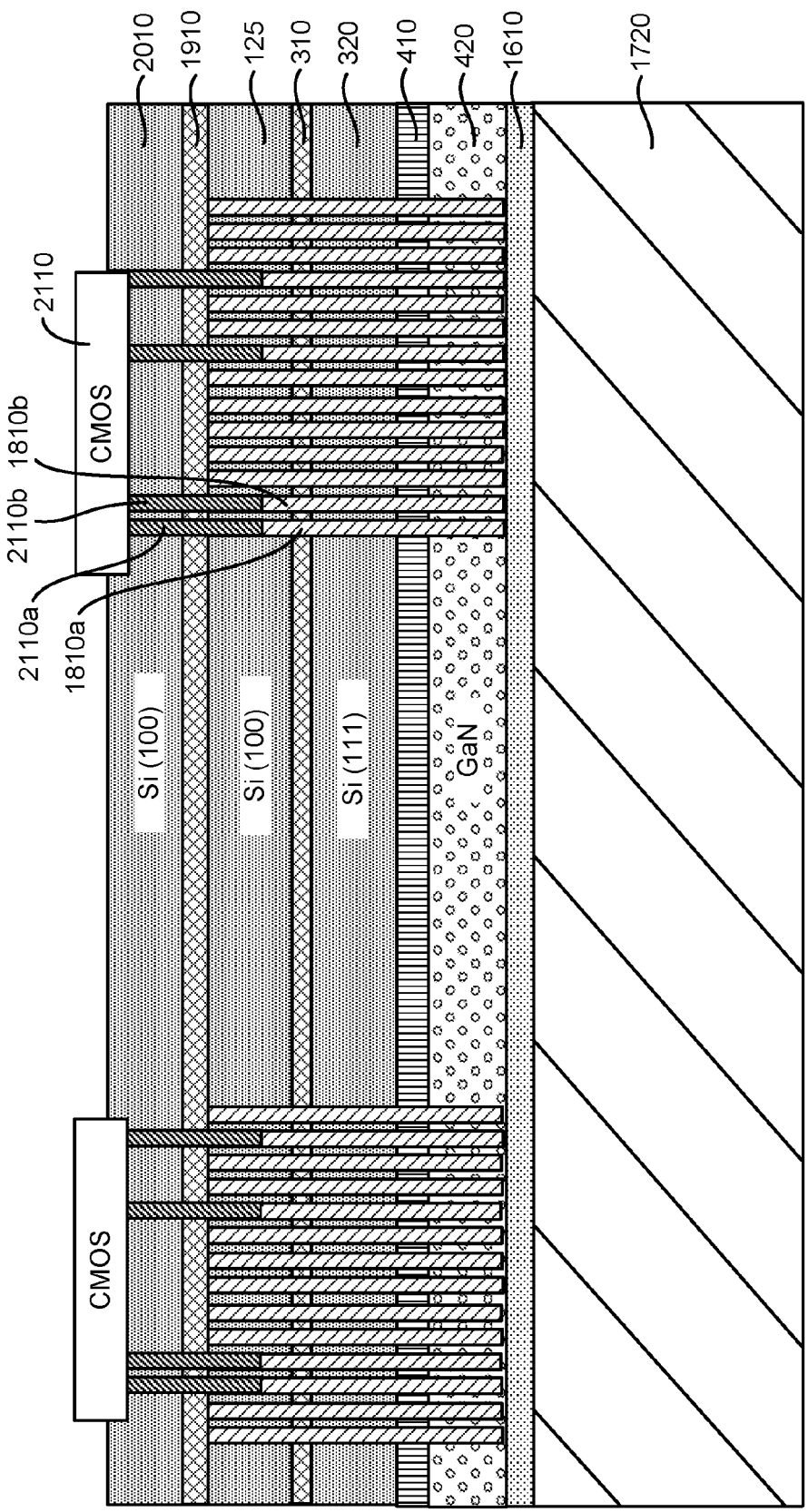
FIG. 22 is a schematic cross-sectional diagram illustrating an intermediate step of fabricating a semiconductor structure according to an embodiment of the present invention.

The method 1800 may further include, at 1822, forming one or more second vias 2110*a*-2110*d* from a surface of the third silicon layer 2010, as illustrated in FIG. 21. The one or more second vias 2110*a*-2110*d* may be formed by dry etch. Each second via runs through the third silicon layer 2010 (e.g., the Si (100) layer) and the second dielectric layer 1910 to connect with one of the first plurality of vias 1710 in the first silicon layer 125 (e.g., the Si (100) layer). A user may select which ones of the buried first plurality of vias 1710 to access based on the layout of the device architecture. The method 1800 may further include, at 1824, filling the one or more second vias 2110*a*-2110*d* with a conductive material. The method 1800 may further include, at 1826, forming one or more silicon based devices 2210, such as complementary metal-oxide-semiconductor (CMOS) devices, on the third silicon layer 2010 (e.g., the Si (100) layer), as illustrated in FIG. 22. The one or more second vias 2110*a*-2110*d* are interconnected to the silicon based devices 2210.

Figure 23:
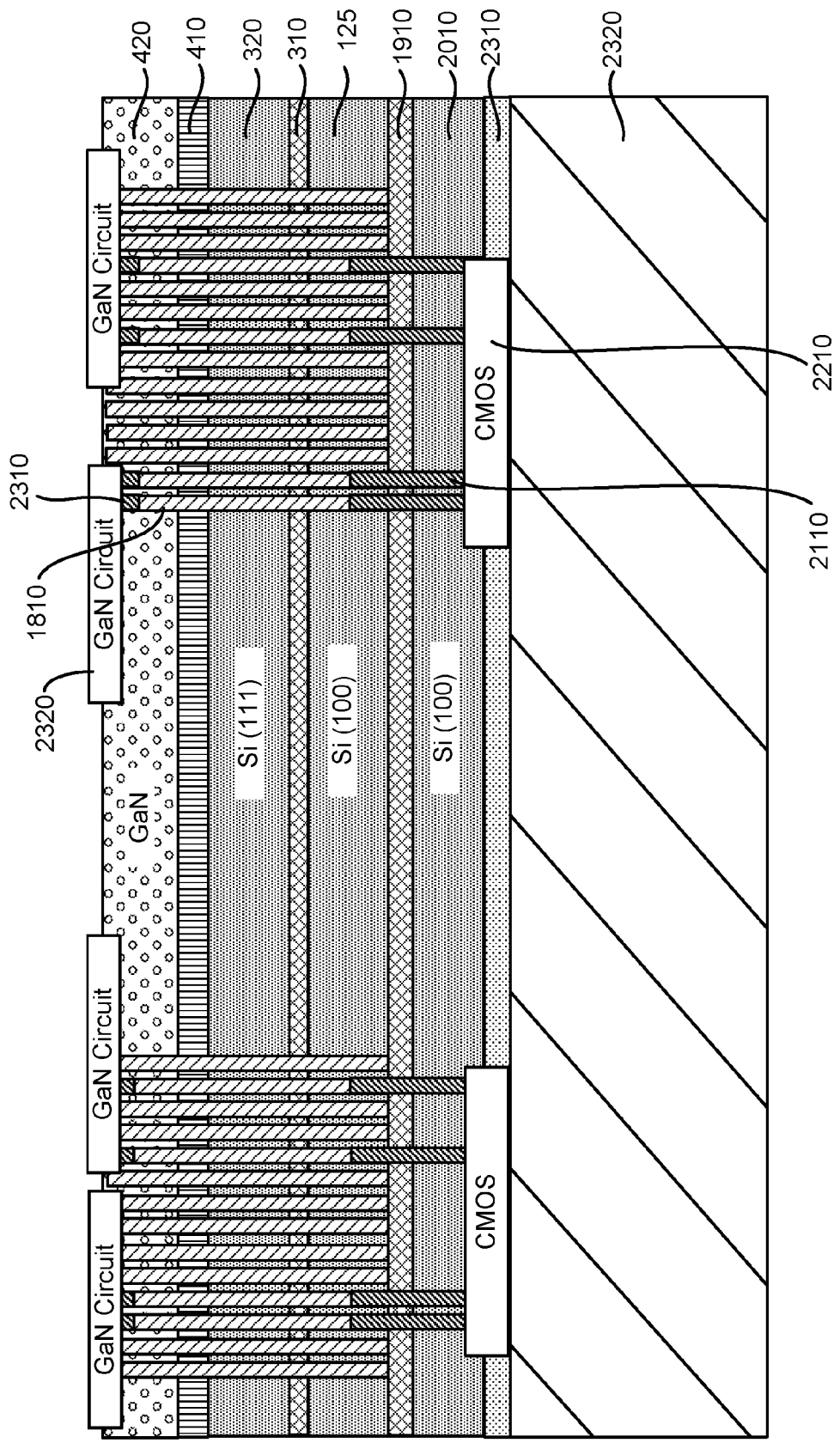
FIG. 23 is a schematic cross-sectional diagram illustrating an intermediate step of fabricating a semiconductor structure according to an embodiment of the present invention.

The structure can then be flipped for fabricating the GaN based devices on the GaN layer 420. The method 1800 further includes attaching the structure to a second carrier wafer 2320 using a temporary adhesive 2310, having the side with the silicon based devices 2210 facing the second carrier wafer 2320, and then removing the first carrier wafer 1720 to expose the GaN layer 420, as illustrated in FIG. 23. The method 1800 may further include, at 1828, forming one or more third vias 2310 from a surface of the GaN layer 420 by dry etch, as illustrated in FIG. 23. Each third via 2310 is connected with a respective second via 2110 through one of the first plurality of vias 1810. The method 1800 may further include, at 1830, filling the one or more third vias 2310 with a conductive material, and at 1832, forming one or more GaN based devices 2320 coupled to the GaN layer 420, as illustrated in FIG. 23. The one or more GaN based devices 2320 are coupled to the silicon based devices 2210 (e.g., CMOS devices) through the one or more third vias 2310, the one or more second vias 2110, and one or more corresponding ones of the first plurality of vias 1810, as illustrated in FIG. 23.

It should be appreciated that the specific steps illustrated in FIGS. 18A and 18B provide a particular method of fabricating a semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIGS. 18A and 18B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 24:
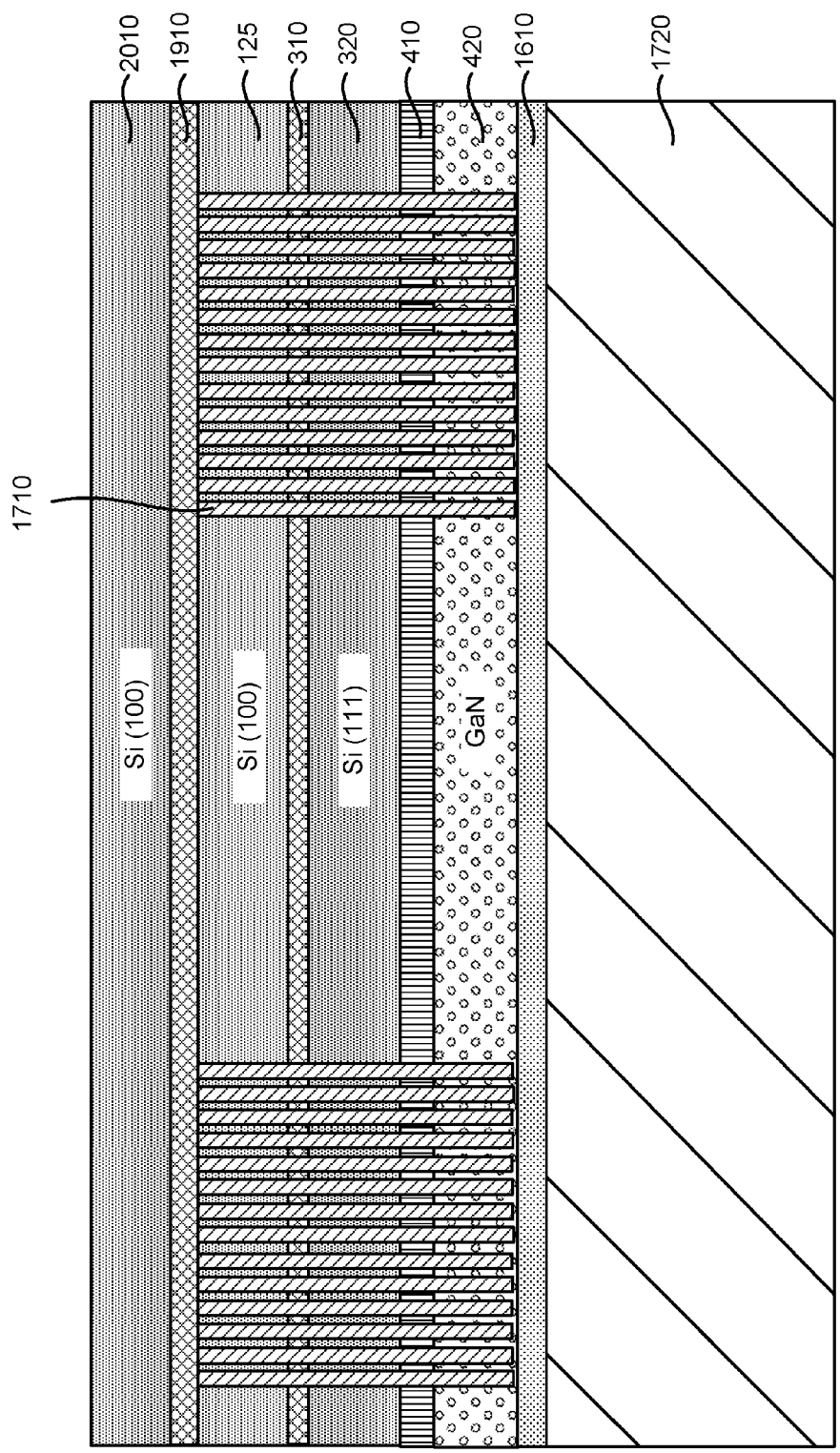
FIG. 24 is a schematic cross-sectional diagram illustrating an intermediate step of fabricating a semiconductor structure according to an embodiment of the present invention.

In another embodiment, after the first plurality of vias 1710 has been formed and the Si (100) layer 2010 has been formed, as illustrated in FIG. 24, the structure may be attached to a second temporary carrier wafer 2520 using a temporary adhesive 2510 with the Si (100) layer 2010 facing the second temporary carrier wafer 2520 and the GaN layer 420 facing up. The first temporary carrier wafer 1720 may then be removed to exposed the GaN layer 420, as illustrated in FIG. 25, so that GaN based devices may be fabricated first before silicon based devices are fabricated.

Figure 26A:
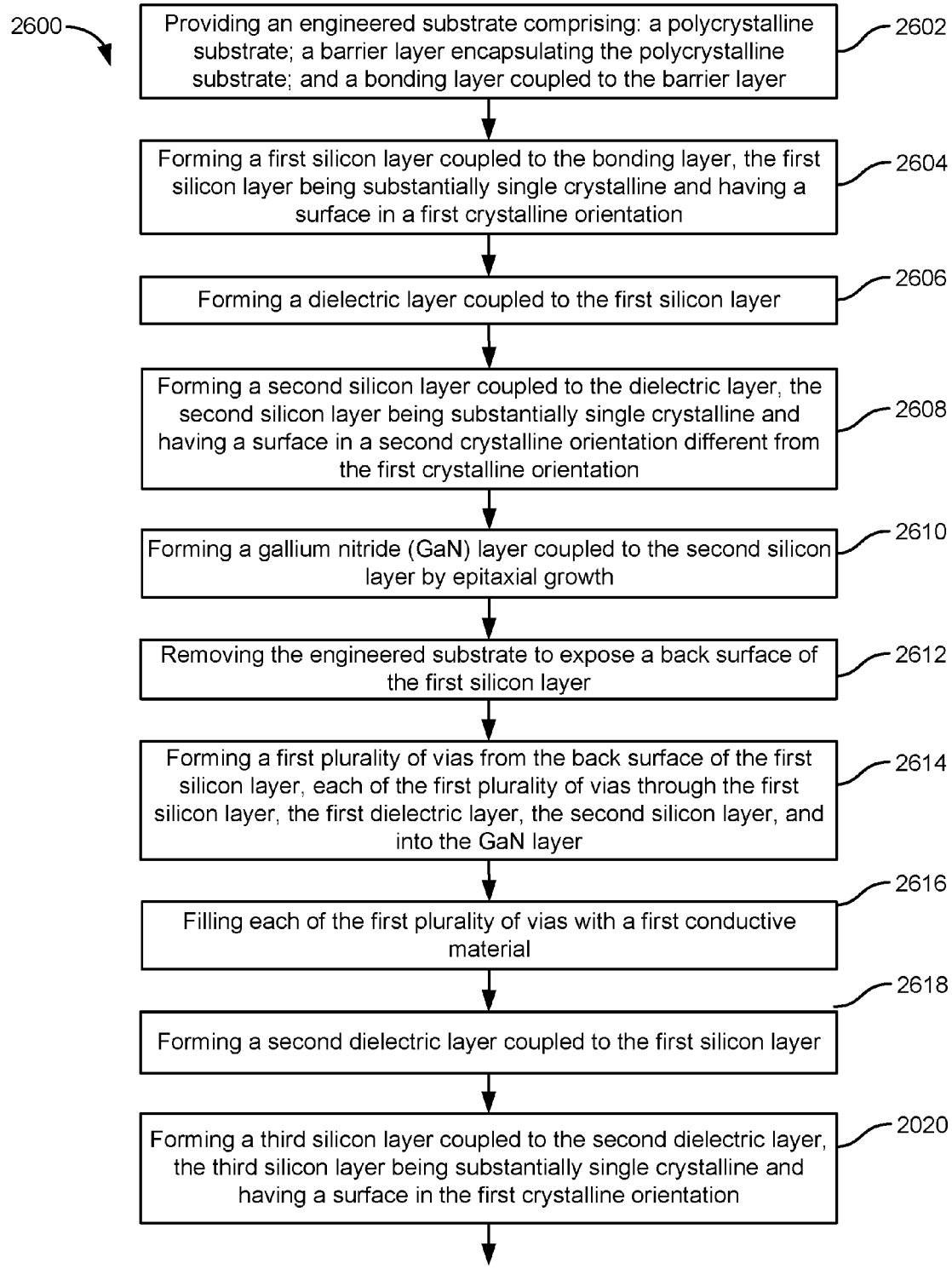
FIGS. 26A and 26B show a simplified flowchart illustrating a method of fabricating a semiconductor structure according to an embodiment of the present invention.
Figure 26B:
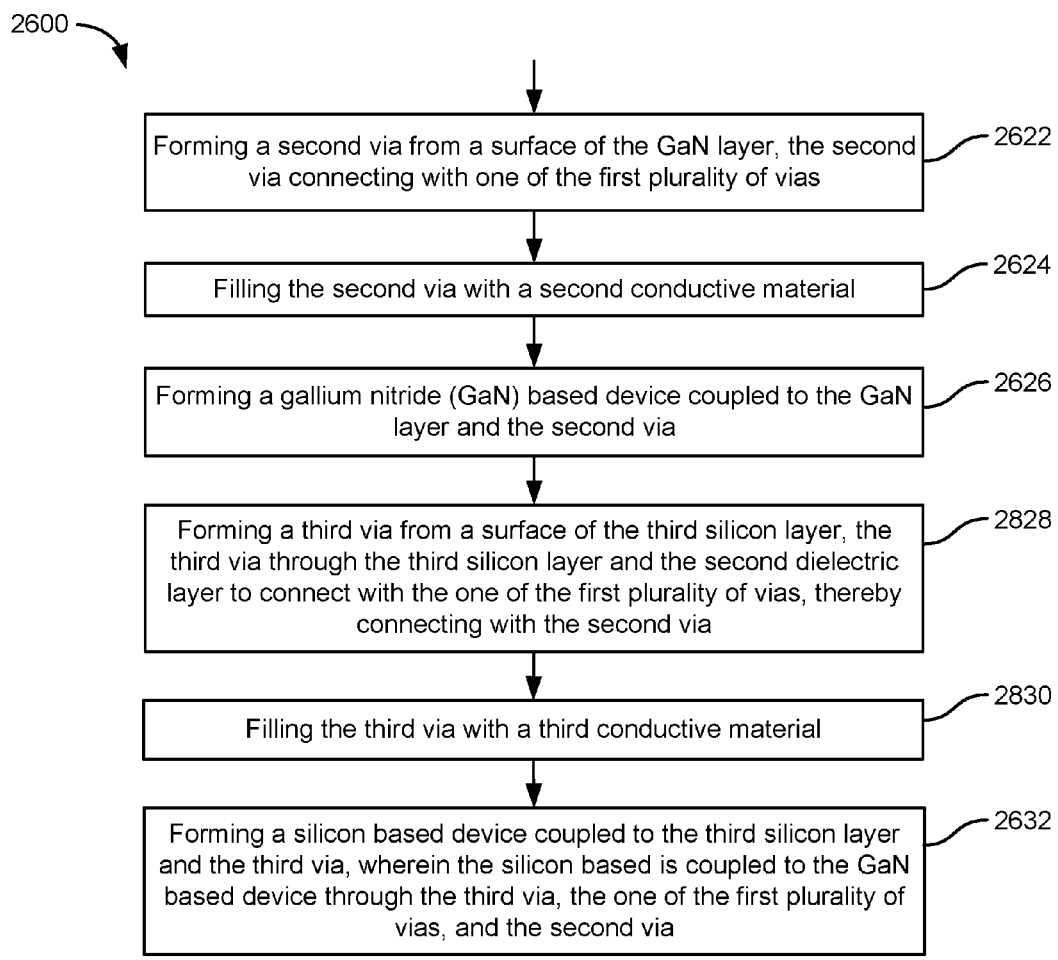

FIGS. 26A and 26B show a simplified flowchart illustrating a method 2600 of fabricating a semiconductor structure according to another embodiment of the present invention. The method 2600 includes steps 2602-2620 that are substantially similar to steps 1802-1820 of the method 1800, as described above. For example, the method 2600 include, at 2602, providing an engineered substrate. The engineered substrate includes a polycrystalline substrate, a barrier layer encapsulating the polycrystalline substrate, and a bonding layer coupled to the barrier layer. The engineered substrate may further include one or more adhesion layers (e.g., TEOS layers) and/or conductive layers (e.g., polycrystalline silicon layers), as described above.

The method 2600 further includes, at 2604, forming a first silicon layer 125 coupled to the bonding layer. The first silicon layer 125 can be substantially single crystalline and can have a surface in a first crystalline orientation (e.g., the Si (100) orientation). The method 2600 further includes, at 2606, forming a first dielectric layer 310 coupled to the first silicon layer 125, and at 2608, forming a second silicon layer 320 coupled to the first dielectric layer 310. The second silicon layer 320 can be substantially single crystalline and can have a surface in a second crystalline orientation different from the first crystalline orientation. For example, the second crystalline orientation may be the Si (111) orientation. The method 2600 further includes, at 2610, forming a gallium nitride (GaN) layer 420 coupled to the second silicon layer 320 by epitaxial growth, and at 2612, removing the engineered substrate to expose a back surface of the first silicon layer 125. The resulting structure is then attached to a first carrier wafer 1720 by the temporary adhesive 1610, with the GaN layer 420 facing the first carrier wafer 1720 and the back surface of the first silicon layer 125 (e.g., the Si (100) layer) facing up. The method 2600 may further include, at 2614, forming a first plurality of vias 1710 from the back surface of the first silicon layer 125. Each of the first plurality of vias 1710 runs through the first silicon layer 125, the first dielectric layer 310, the second silicon layer 320, and into the GaN layer 420. The method 2600 further includes, at 2616, filling each of the first plurality of vias 1710 with a conductive material. Thus, the first plurality of vias 1710 are pre-formed, and may be selectively accessed later as described below. The method 2600 may further include, at 2618, forming a second dielectric layer 1910 coupled to the first silicon layer 125 (e.g., the Si (100) layer), and at 2620, forming a third silicon layer 2010 coupled to the second dielectric layer 1910. The third silicon layer 2010 can be substantially single crystalline and can have a surface in the first crystalline orientation, such as the Si (100) orientation. The resulting structure is illustrated in FIG. 24.

Figure 25:
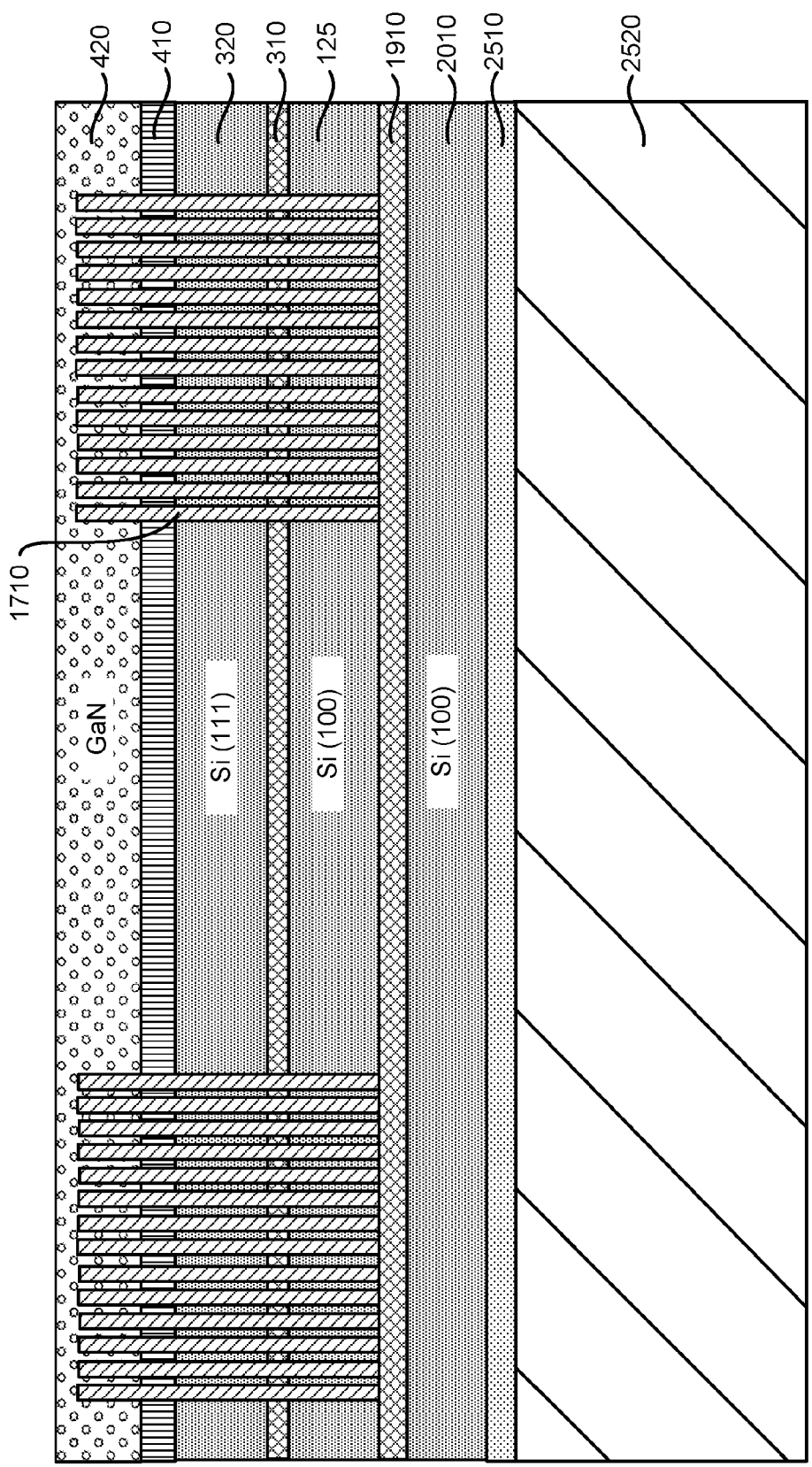
FIG. 25 is a schematic cross-sectional diagram illustrating an intermediate step of fabricating a semiconductor structure according to an embodiment of the present invention.
Figure 27A:
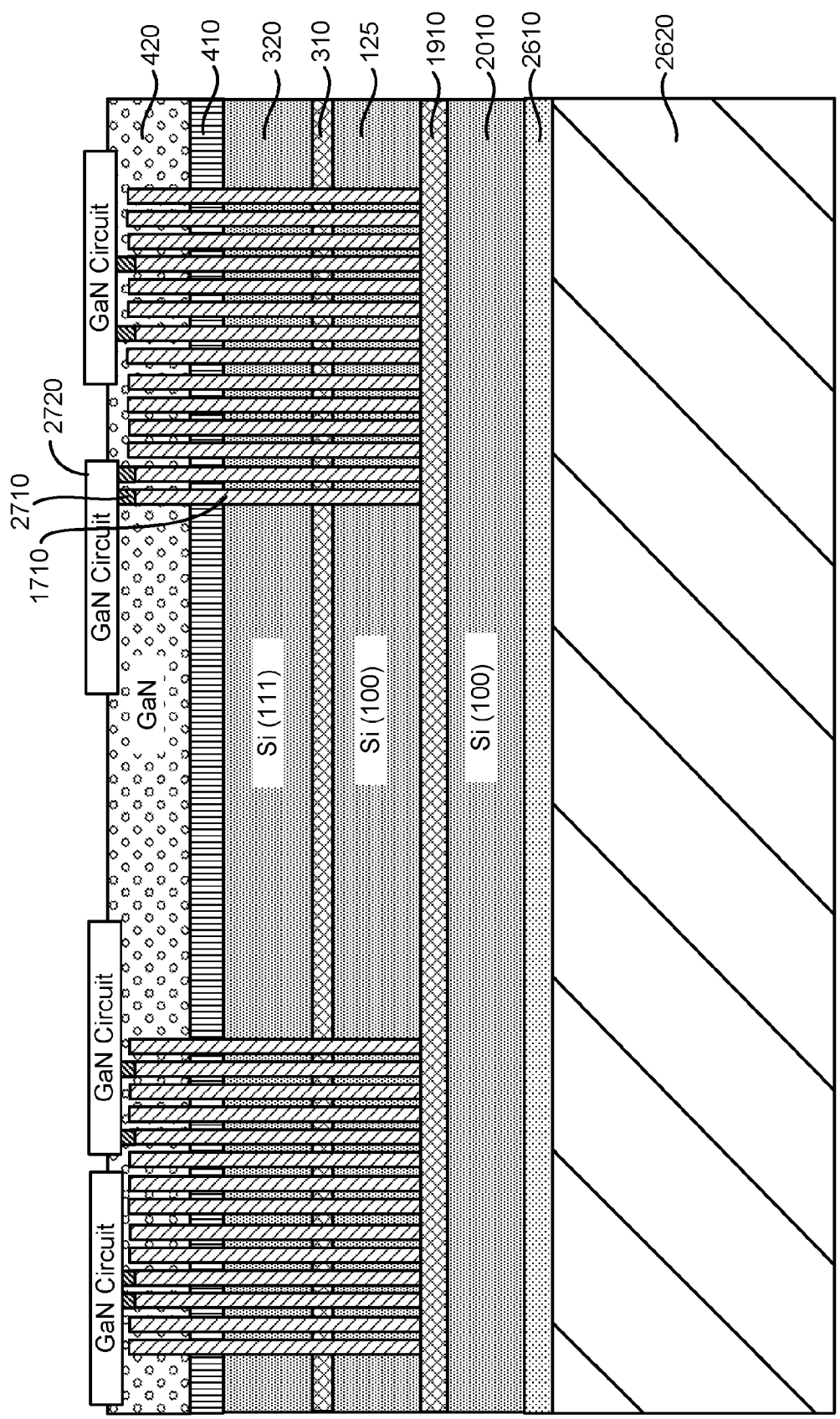
FIGS. 27A and 27B show a schematic cross-sectional diagram illustrating an intermediate step of fabricating a semiconductor structure according to an embodiment of the present invention.

The method 2600 may further include attaching the structure to a second carrier wafer 2510 having the third silicon layer 2010 (e.g., the Si (100) layer) facing the second carrier wafer 2520, and remove the first carrier wafer 1720 to expose the GaN layer 420, as illustrated in FIG. 25. The method 2600 may further include, at 2622, forming one or more second vias 2710 from a surface of the GaN layer 420. Each of the one or more second vias 2710 is connected with one of the first plurality of vias 1710, as illustrated in FIG. 27A. The method 2600 may further include, at 2624, filling the one or more second vias 2710 with a conductive material. The positions of the one or more second vias 2710 may be chosen based on the layout of the GaN based devices 2720 to be subsequently formed. The method 2600 may further include, at 2626, forming one or more GaN based devices 2720 coupled to the GaN layer 420, as illustrated in FIG. 27A. The one or more GaN based devices are interconnected to the one or more second vias 2710.

Figure 27B:
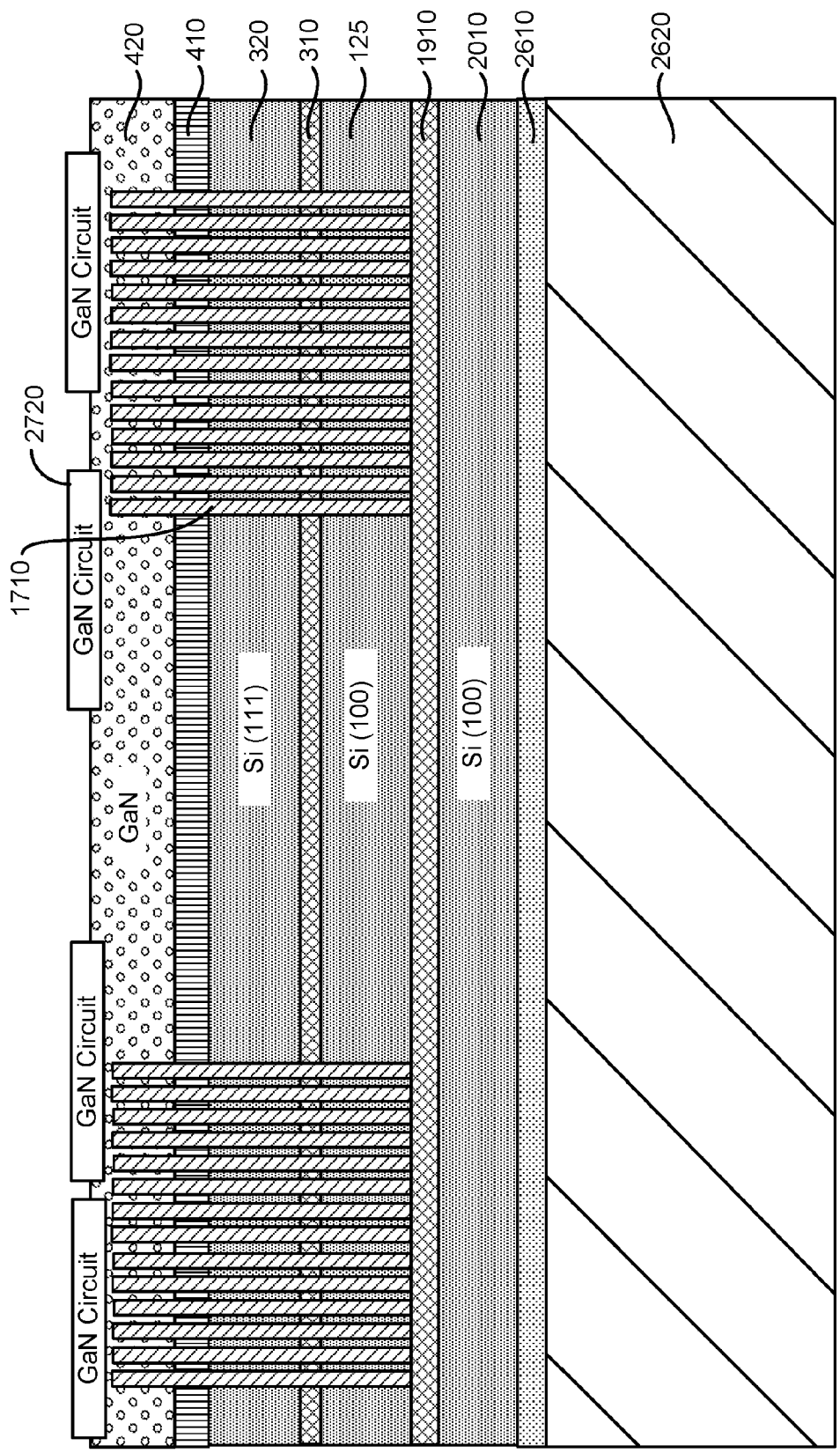

In an alternative embodiment, the GaN based devices 2720 may be fabricated before the second vias 2710 are formed, as illustrated in FIG. 27B. Then one or more second vias (not shown in FIG. 27B) may be formed to access selected ones of the first plurality of vias 1710. Interconnection between the second vias and the GaN based devices 2720 can be made. The choice of whether to form the second vias first or last depends on the thermal stability and process flow compatibility between the via processing steps and the device processing steps.

Figure 28:
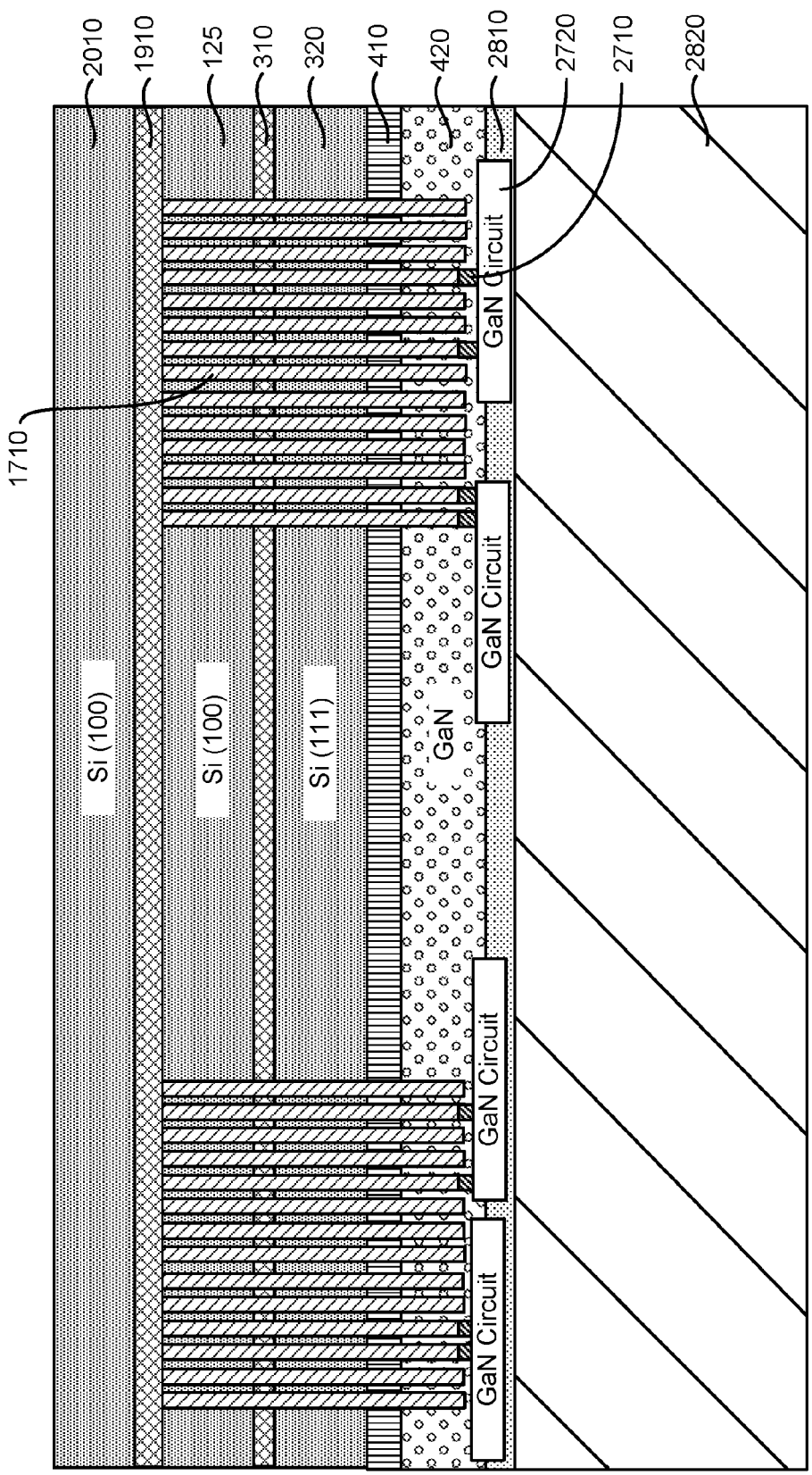
FIG. 28 is a schematic cross-sectional diagram illustrating an intermediate step of fabricating a semiconductor structure according to an embodiment of the present invention.
Figure 29:
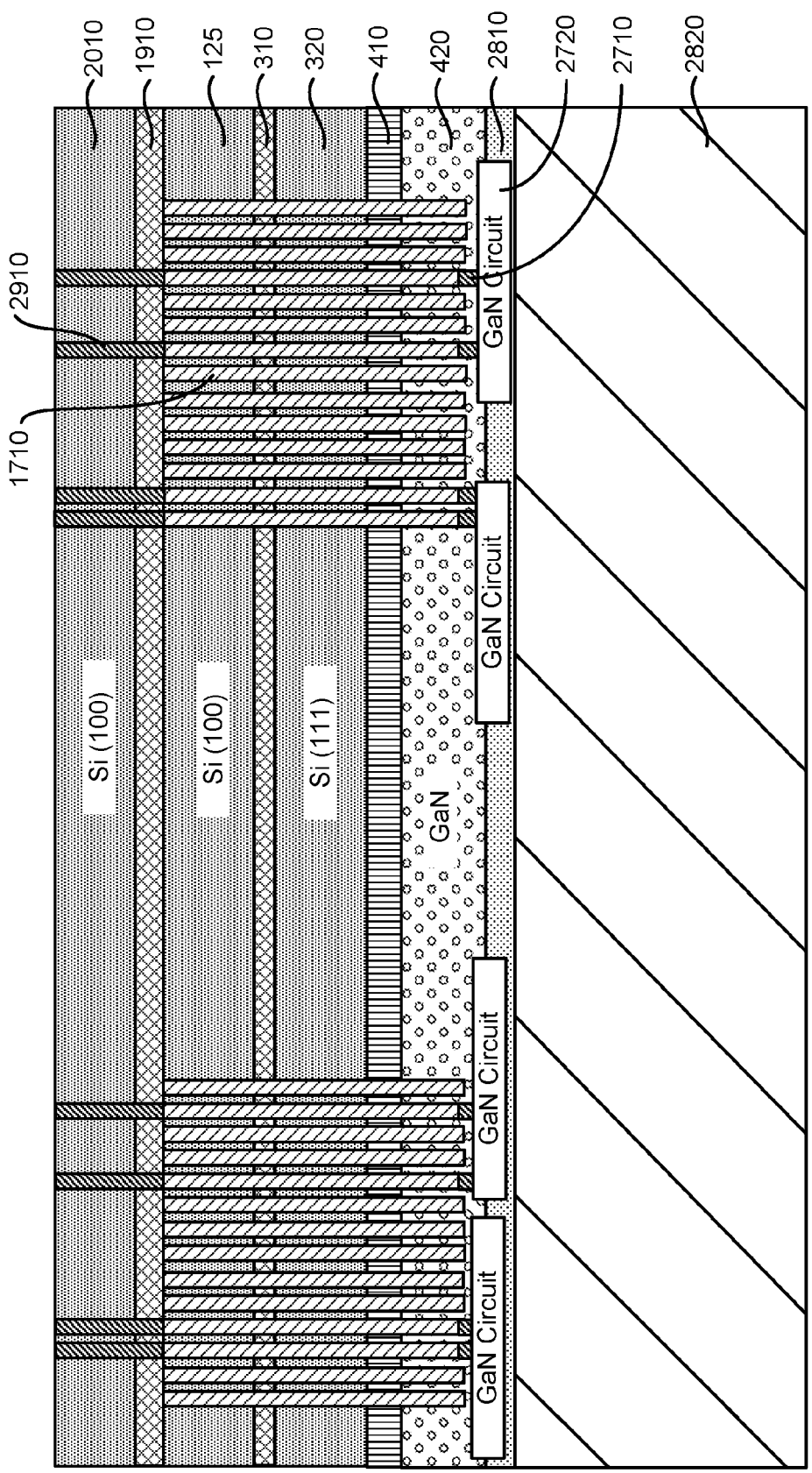
FIG. 29 is a schematic cross-sectional diagram illustrating an intermediate step of fabricating a semiconductor structure according to an embodiment of the present invention.
Figure 30:
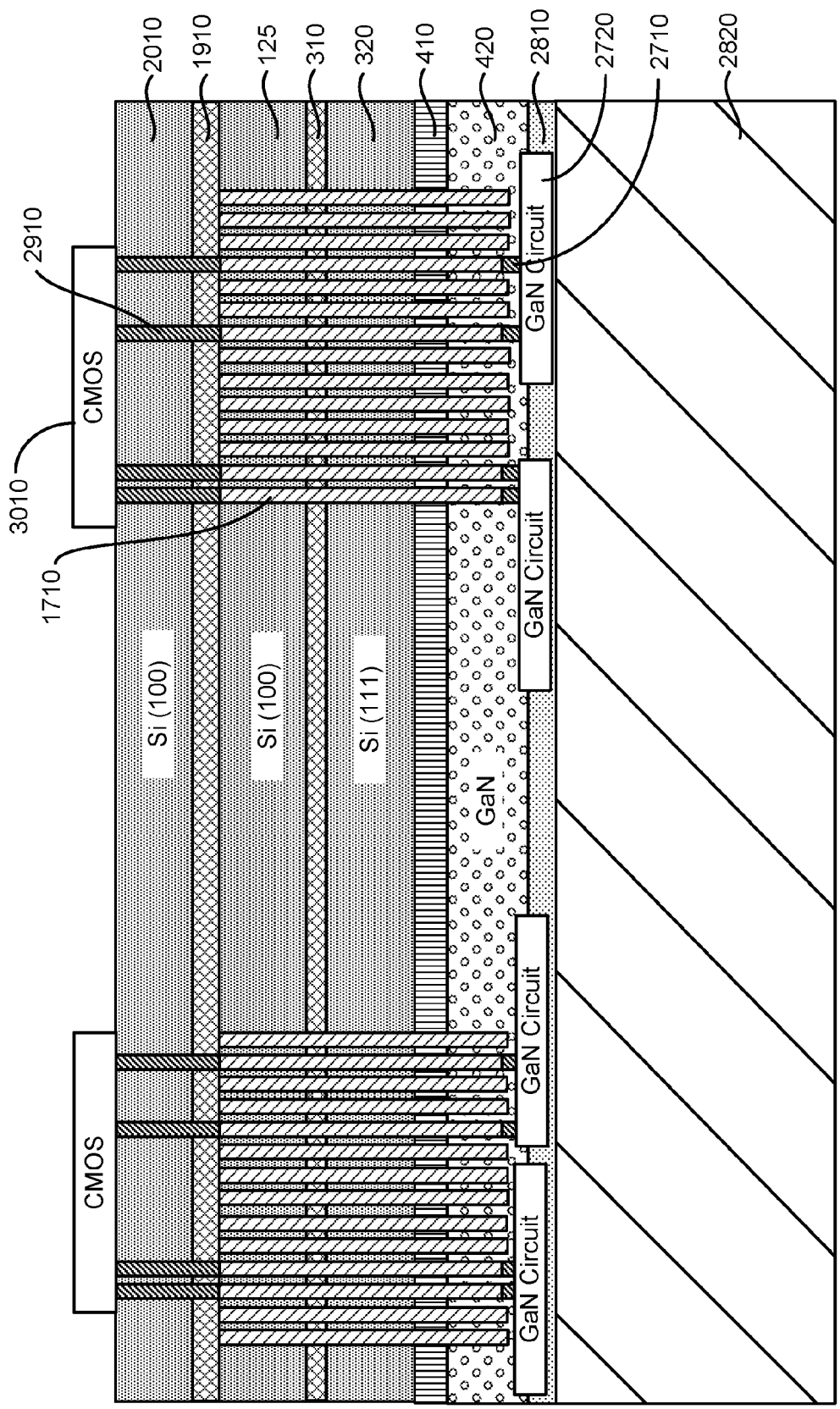
FIG. 30 is a schematic cross-sectional diagram illustrating an intermediate step of fabricating a semiconductor structure according to an embodiment of the present invention.

The structure can then be flipped for fabricating silicon based devise on the third silicon layer 2010 (e.g., a Si (100) layer). The method 2600 may further include attaching the structure to a third carrier wafer 2820 using a temporary adhesive 2810 having the side with the GaN based devices 2720 facing the third carrier wafer 2820, and then removing the second carrier wafer 2620 to expose the third silicon layer 2010 (e.g., the Si (100) layer), as illustrated in FIG. 28. The method 2600 may further include, at 2628, forming one or more third vias 2910 from a surface of the third silicon layer 2010. Each third via 2910 runs through the third silicon layer 2010 and the second dielectric layer 1910 to connect with a respective one of the one or more second vias 2710 through a corresponding one of the first plurality of vias 1710, as illustrated in FIG. 29. The method 2600 may further include, at 2630, filling the one or more third vias 2910 with a conductive material. The method 2600 may further include, at 2632, forming one or more silicon based devices 3010, such as complementary metal-oxide-semiconductor (CMOS) devices, coupled to the third silicon layer 2010, as illustrated in FIG. 30. The one or more silicon based devices 3010 are coupled to the one or more GaN based devices 2720 through the one or more third vias 2910, the one or more second vias 2710, and one or more corresponding ones of the first plurality of vias 1710, as illustrated in FIG. 30. In another embodiment, the one or more third vias 2910 may be formed after the silicon based devices are formed. The choice of whether to form the third vias 2910 first or last depends on the thermal stability and process flow compatibility between the via processing steps and the device processing steps.

It should be appreciated that the specific steps illustrated in FIGS. 26A and 26B provide a particular method of fabricating a semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIGS. 26A and 26B may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, after the GaN based devices and the silicon based devices have been fabricated, backend redistribution (RDL) pads and solder balls may be formed on the first silicon layer (e.g., the Si (100) layer). The carrier wafer can then be removed, and the structure can be transferred to a dicing tape for dicing and packaging, similar to the steps illustrated in FIGS. 10-15 or other packaging processing steps.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a semiconductor structure, the method comprising:
providing an engineered substrate, the engineered substrate comprising:
a polycrystalline substrate;
a barrier layer encapsulating the polycrystalline substrate; and
a bonding layer coupled to the barrier layer;
forming a first silicon layer coupled to the bonding layer, the first silicon layer being substantially single crystalline and having a surface in a first crystalline orientation;
forming a dielectric layer coupled to the first silicon layer;
forming a second silicon layer coupled to the dielectric layer, the second silicon layer being substantially single crystalline and having a surface in a second crystalline orientation different from the first crystalline orientation;
forming a gallium nitride (GaN) layer coupled to the second silicon layer by epitaxial growth;
forming a gallium nitride (GaN) based device coupled to the GaN layer by epitaxial growth;
removing the engineered substrate to expose a back surface of the first silicon layer;
forming a silicon based device coupled to the back surface of the first silicon layer;
forming a via from the back surface of the first silicon layer, the via through the first silicon layer, the dielectric layer, the second silicon layer, and the GaN layer;
filling the via with a conducting material; and
interconnecting the GaN based device and the silicon based device through the via.

2. The method of claim 1 wherein the polycrystalline substrate comprises polycrystalline aluminum gallium nitride (AlGaN).

3. The method of claim 1 wherein the barrier layer comprises silicon nitride.

4. The method of claim 1 wherein the first crystalline orientation is (100) orientation of silicon, and the second crystalline orientation is (111) orientation of silicon.

5. The method of claim 1 wherein the silicon based device comprises a complementary metal-oxide-semiconductor (CMOS) device.

6. The method of claim 1 further comprising, before forming the GaN layer, forming a buffer layer coupled to the second silicon layer by epitaxial growth, and wherein the GaN layer is formed on the buffer layer.

7. A method of fabricating a semiconductor structure, the method comprising:
providing an engineered substrate, the engineered substrate comprising:
a polycrystalline substrate;
a barrier layer encapsulating the polycrystalline substrate; and
a bonding layer coupled to the barrier layer;
forming a first silicon layer coupled to the bonding layer, the first silicon layer being substantially single crystalline and having a surface in a first crystalline orientation;
forming a first dielectric layer coupled to the first silicon layer;
forming a second silicon layer coupled to the first dielectric layer, the second silicon layer being substantially single crystalline and having a surface in a second crystalline orientation different from the first crystalline orientation;
forming a gallium nitride (GaN) layer coupled to the second silicon layer by epitaxial growth;
removing the engineered substrate to expose a back surface of the first silicon layer;
forming a first plurality of vias from the back surface of the first silicon layer, each of the first plurality of vias through the first silicon layer, the first dielectric layer, the second silicon layer, and into the GaN layer;
filling each of the first plurality of vias with a first conductive material;
forming a second dielectric layer coupled to the first silicon layer;

forming a third silicon layer coupled to the second dielectric layer, the third silicon layer being substantially single crystalline and having a surface in the first crystalline orientation;

forming a second via from a surface of the third silicon layer, the second via through the third silicon layer and the second dielectric layer to connect with one of the first plurality of vias;

filling the second via with a second conductive material;

forming a silicon based device coupled to the third silicon layer and the second via;

forming a third via from a surface of the GaN layer, the third via connecting with the second via through the one of the first plurality of vias;

filling the third via with a third conductive material; and forming a gallium nitride (GaN) based device coupled to the GaN layer and the third via, wherein the GaN based device is coupled to the silicon based device through the third via, the one of the first plurality of vias, and the third via.

8. The method of claim 7 wherein the polycrystalline substrate comprises polycrystalline aluminum gallium nitride (AlGaN).

9. The method of claim 7 wherein the barrier layer comprises silicon nitride.

10. The method of claim 7 wherein the first crystalline orientation is (100) orientation of silicon, and the second crystalline orientation is (111) orientation of silicon.

11. The method of claim 7 wherein the silicon based device comprises a complementary metal-oxide-semiconductor (CMOS) device.

12. The method of claim 7 further comprising, before forming the GaN layer, forming a buffer layer coupled to the second silicon layer by epitaxial growth, and wherein the GaN layer is formed on the buffer layer.

13. A method of fabricating a semiconductor structure, the method comprising:
providing an engineered substrate, the engineered substrate comprising:
a polycrystalline substrate;
a barrier layer encapsulating the polycrystalline substrate; and
a bonding layer coupled to the barrier layer;
forming a first silicon layer coupled to the bonding layer, the first silicon layer being substantially single crystalline and having a surface in a first crystalline orientation;
forming a first dielectric layer coupled to the first silicon layer;
forming a second silicon layer coupled to the first dielectric layer, the second silicon layer being substantially single crystalline and having a surface in a second crystalline orientation different from the first crystalline orientation;

forming a gallium nitride (GaN) layer coupled to the second silicon layer by epitaxial growth;

removing the engineered substrate to expose a back surface of the first silicon layer;

forming a first plurality of vias from the back surface of the first silicon layer, each of the first plurality of vias through the first silicon layer, the first dielectric layer, the second silicon layer, and into the GaN layer;

filling each of the first plurality of vias with a first conductive material;

forming a second dielectric layer coupled to the first silicon layer;

forming a third silicon layer coupled to the second dielectric layer, the third silicon layer being substantially single crystalline and having a surface in the first crystalline orientation;

forming a second via from a surface of the GaN layer, the second via connecting with one of the first plurality of vias;

filling the second via with a second conductive material;

forming a gallium nitride (GaN) based device coupled to the GaN layer and the second via;

forming a third via from a surface of the third silicon layer, the third via through the third silicon layer and the second dielectric layer to connect with the one of the first plurality of vias, thereby connecting with the second via;

filling the third via with a third conductive material; and forming a silicon-based coupled to the third silicon layer and the third via, wherein the silicon based device is coupled to the GaN based device through the third via, the one of the first plurality of vias, and the second via.

14. The method of claim 13 wherein the polycrystalline substrate comprises polycrystalline aluminum gallium nitride (AlGaN).

15. The method of claim 13 wherein the barrier layer comprises silicon nitride.

16. The method of claim 13 wherein the first crystalline orientation is (100) orientation of silicon, and the second crystalline orientation is (111) orientation of silicon.

17. The method of claim 13 wherein the silicon based device comprises a complementary metal-oxide-semiconductor (CMOS) device.

18. The method of claim 13 further comprising, before forming the GaN layer, forming a buffer layer coupled to the second silicon layer by epitaxial growth, and wherein the GaN layer is formed on the buffer layer.

19. The method of claim 13 wherein the second via is formed before the GaN based device is formed.

20. The method of claim 13 wherein the second via is formed after the GaN based device is formed.

* * * * *